(12) United States Patent
Lee

(10) Patent No.: US 11,181,561 B2
(45) Date of Patent: Nov. 23, 2021

(54) FOREIGN SUBSTANCE DETECTING CIRCUITS, ELECTRONIC DEVICES HAVING THE SAME, AND FOREIGN SUBSTANCE DETECTING METHODS

(71) Applicant: Samsung Electronics Co., Ltd., Suwon-si (KR)

(72) Inventor: Sungeun Lee, Suwon-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 58 days.

(21) Appl. No.: 16/686,757

(22) Filed: Nov. 18, 2019

(65) Prior Publication Data

US 2020/0333382 A1 Oct. 22, 2020

(30) Foreign Application Priority Data

Apr. 22, 2019 (KR) .................. 10-2019-0046937

(51) Int. Cl.
*G01R 19/165* (2006.01)
*G01R 31/58* (2020.01)

(52) U.S. Cl.
CPC ....... *G01R 19/16533* (2013.01); *G01R 31/58* (2020.01)

(58) Field of Classification Search
None
See application file for complete search history.

(56) References Cited

U.S. PATENT DOCUMENTS

| 8,708,745 | B2 | 4/2014 | Golko et al. |
| 9,396,148 | B2 | 7/2016 | Inha et al. |
| 2017/0110835 | A1* | 4/2017 | Hasegawa ........... G06F 13/4081 |
| 2017/0290134 | A1 | 10/2017 | Sun et al. |
| 2018/0062325 | A1* | 3/2018 | Kim .................. H01R 13/6683 |
| 2018/0181509 | A1 | 6/2018 | Jo |
| 2018/0254626 | A1* | 9/2018 | Bemat ...................... H02H 3/04 |
| 2018/0269876 | A1 | 9/2018 | Lo et al. |
| 2018/0287302 | A1 | 10/2018 | Kim et al. |

FOREIGN PATENT DOCUMENTS

| EP | 2924584 A2 | 9/2015 |
| JP | 5788608 B2 | 10/2015 |
| KR | 10-2016-0148401 A | 12/2016 |
| KR | 10-2017-0113307 A | 10/2017 |
| KR | 10-2018-0109444 A | 10/2018 |

* cited by examiner

*Primary Examiner* — Jas A Sanghera

(74) *Attorney, Agent, or Firm* — Harness, Dickey & Pierce, P.L.C.

(57) ABSTRACT

A foreign substance detecting circuit may include a voltage detector that may detect a voltage level from a first pin of a connector, a slope detector that may detect a voltage slope indicating a change of the voltage level based two voltage levels from the first pin, and a foreign substance determining device that may determine a presence of a foreign substance in the connector. The foreign substance determining device may determine whether a resistance range of an external device is detected from the at least one first pin based on the detected voltage level. The foreign substance determining device may, when the resistance range is detected, determine that the foreign substance is present in the connector, based on the voltage slope having a value determined to correspond to charge and discharge characteristics due to a capacitance element of the foreign substance.

20 Claims, 14 Drawing Sheets

FIG. 11

| STATE | RESISTANCE | Capacitor | RESISTANCE (3.7V Pull up) |
|---|---|---|---|
| Open | GREATER THAN 1 M ohm | 0 | 35V/1ms |
| PHONE RECOGNITION | 5.1K ohm | 0 | 18V/1ms |
| CABLE RECOGNITION | 1.1K ohm | 0 | 20V/1ms |
| FRESHWATER | 10K ohm ~ 1M ohm | 1uF | 1.5V/1ms |
| SALT WATER | 0 ohm ~ 10K ohm | 0.5uF | 0.5V/1ms |

FOREIGN SUBSTANCE DETECTING CIRCUITS, ELECTRONIC DEVICES HAVING THE SAME, AND FOREIGN SUBSTANCE DETECTING METHODS

CROSS-REFERENCE TO RELATED APPLICATION

This application claims the benefit of Korean Patent Application No. 10-2019-0046937, filed on Apr. 22, 2019, in the Korean Intellectual Element Office, the disclosure of which is incorporated herein in its entirety by reference.

BACKGROUND

The inventive concepts relate to foreign substance detecting circuits, and more particularly, to foreign substance detecting circuits having improved foreign substance detection performance, electronic devices including the foreign substance detecting circuits, and methods of detecting foreign substances.

When a foreign substance is introduced into a connector, corrosion of the connector may occur. In some example embodiments, when water, a type of foreign substance, is introduced into the connector and currents flow through the connector in this situation, pins of the connector may corrode based on presence of the water contacting the pins while currents flow through the connector.

SUMMARY

The inventive concepts provide foreign substance detecting circuits configured to reduce or prevent corrosion of a connector based on accurately recognizing a foreign substance introduced into the connector and/or accurately determining a situation in which a foreign substance is introduced into the connector, electronic devices including the foreign substance detecting circuits, and methods of detecting foreign substances.

According to some example embodiments, a foreign substance detecting circuit may include a voltage detector electrically connected to at least one first pin of a connector, the connector including a plurality of pins, the voltage detector configured to detect a voltage level from the at least one first pin. The foreign substance detecting circuit may include a slope detector configured to detect a voltage slope indicating an amount of change in the voltage level, based on at least two voltage levels detected from the at least one first pin by the voltage detector. The foreign substance detecting circuit may include a foreign substance determining device configured to determine whether a foreign substance is present in the connector based on performing a first determining operation and a second determining operation. Performing the first determining operation may include determining whether a resistance of the at least one first pin is within a resistance range corresponding to an external device is detected from the at least one first pin, based on the voltage level detected from the at least one first pin by the voltage detector. Performing the second determining operation may include determining whether the foreign substance is present in the connector, based on whether the voltage slope has a value determined to correspond to charge and discharge characteristics due to a capacitance element of the foreign substance.

According to some example embodiments, a method may include detecting a voltage level from a first pin of a connector, the connector including a plurality of pins. The method may include determining whether a resistance of the first pin is within a first resistance range corresponding to connection of the connector with an external device, based on comparing the detected voltage level with a reference voltage level. The method may include determining whether a foreign substance is present in the connector based on a determination of whether the resistance of the first pin is not within the first resistance range, or a comparison of a voltage slope detected based on the detected voltage level with a reference voltage slope value in response to a determination that the resistance of the first pin is within the first resistance range. The method may include selectively controlling an internal operation of an electronic device that includes the connector in response to the determination of whether the foreign substance is present in the connector.

According to some example embodiments, an electronic device may include a connector configured to be connected to an external device and comprising a plurality of pins. The electronic device may include a foreign substance detecting circuit configured to determine whether a foreign substance is present in the connector or the external device is connected to the connector based on performing a first determining operation and a second determining operation. Performing the first determining operation may include determining whether a resistance of a first pin of the connector is within a resistance range corresponding to the external device, based on a voltage level detected from the first pin. Performing the second determining operation may include determining whether the foreign substance is present in the connector, based on a voltage slope determined based on the voltage level detected from the first pin. The foreign substance detecting circuit may be configured to determine whether the external device is connected to the connector in response to determining whether both the resistance of the first pin is within the resistance range of the external device and the voltage slope satisfies a certain condition. The electronic device may include an application processor configured to control an internal operation of the electronic device in response to the determination of whether the foreign substance is present in the connector or the external device is connected to the connector.

BRIEF DESCRIPTION OF THE DRAWINGS

Example embodiments of the inventive concepts will be more clearly understood from the following detailed description taken in conjunction with the accompanying drawings in which:

FIG. 11 is a table showing examples of resistances, capacitance elements, and voltage slopes in various states of a connector according to some example embodiments of the inventive concepts;

DETAILED DESCRIPTION

Hereinafter, example embodiments of the inventive concepts will be described in detail with reference to the accompanying drawings.

A connector may have various structures. According to some example embodiments of the inventive concepts, there is provided a method of detecting water for reduce or preventing corrosion of connectors having various structures, by accurately determining a situation in which a foreign substance, such as water, etc., is introduced into the connectors. In some example embodiments hereinafter, as a structure of the connector, a universal serial bus (USB) Type-C structure or a USB power delivery (USB PD) Type-C structure is disclosed, and thus, it is assumed that the connector performs communication based on a USB Type-C interface. However, embodiments of the inventive concepts may be applied to connectors of other various structures in the same or substantially the same manner. In some example embodiments, some example embodiments of the inventive concepts may be applied to other types of USB connector structures. In some example embodiments, in some example embodiments hereinafter, it is described that as an example of a foreign substance, water is introduced into the connector. However, some example embodiments of the inventive concepts may be applied to other various types of foreign substances which may be introduced into the connector. Thus, a foreign substance detecting circuit and a method of detecting a foreign substance, according to some example embodiments of the inventive concepts, may also be referred to as a water detecting circuit and a method of detecting water.

When the water is recognized, a system may determine the water as resistance. When there is no water, a resistance that is very large or of an infinite value is detected, as a floating state. However, when the water is introduced, a resistance that is relatively small rather than of an infinite value, is detected. There may be various methods of monitoring the resistance, and various methods of monitoring the resistance may be selectively used.

Figure 1:
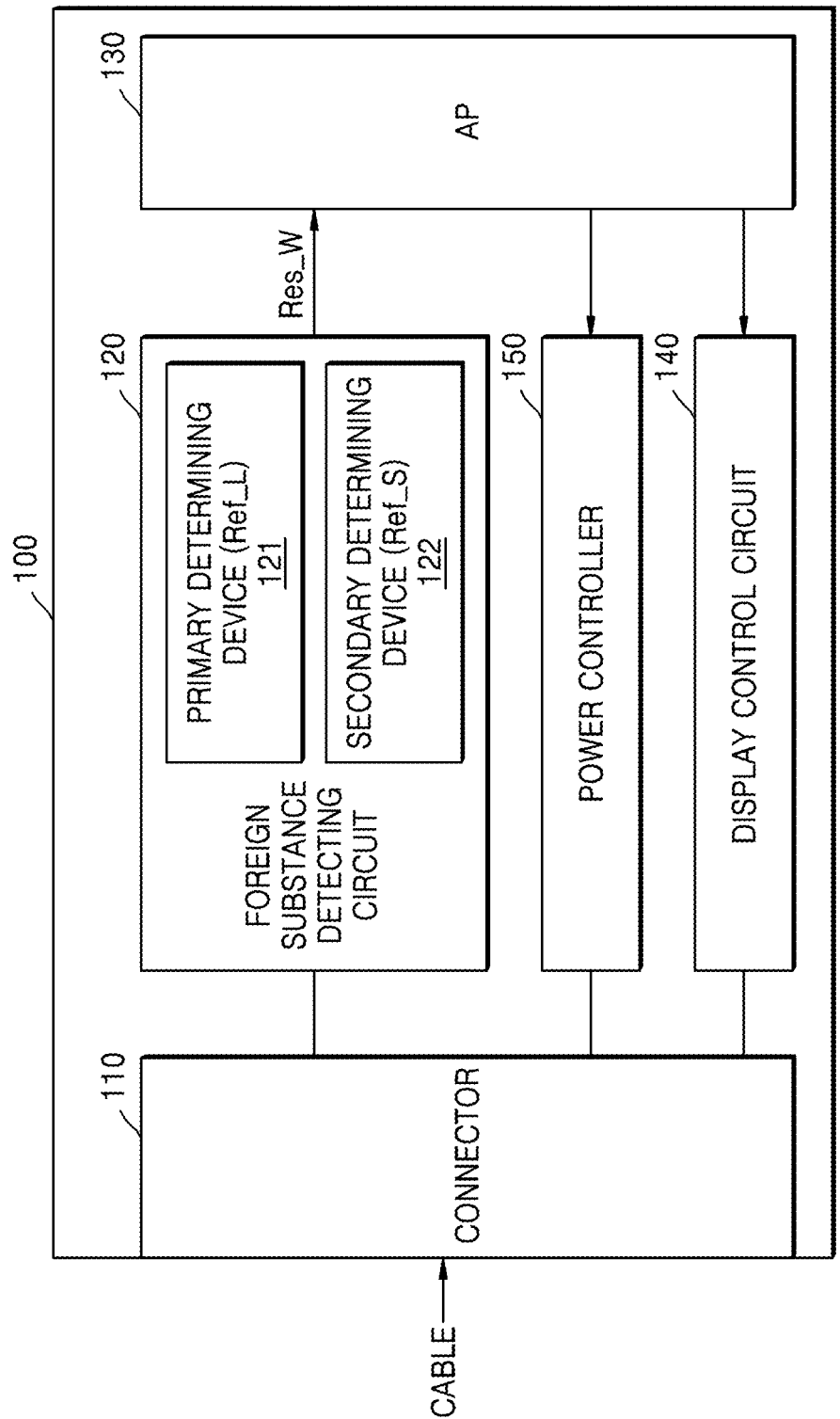
FIG. 1 is a block diagram of an electronic device including a water detecting circuit according to some example embodiments of the inventive concepts.

FIG. 1 is a block diagram of an electronic device including a water detecting circuit according to some example embodiments of the inventive concepts.

Referring to FIG. 1, an electronic device (or an electronic system) 100 may include a connector 110 configured to be connected to an external cable and enable communication between an external device and the electronic device 100. In some example embodiments, the electronic device 100 may include a foreign substance detecting circuit 120 connected to at least one pin of the connector 110. In some example embodiments, the electronic device 100 may include a processor configured to control general operations of the electronic device 100. In some example embodiments, the electronic device 100 may include an application processor 130. In some example embodiments, the electronic device 100 may further include a display control circuit 140 and a power controller 150.

In some example embodiments, one or more, or all, of the foreign substance detecting circuit 120, the application processor 130, the display control circuit, and the power controller 150, and/or any parts thereof, may be included in, may include, and/or may be implemented by, one or more instances of processing circuitry 115 such as hardware including logic circuits; a hardware/software combination such as a processor executing software; or a combination thereof. For example, the processing circuitry 115 more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. In some example embodiments, the processing circuitry 115 may include a non-transitory computer readable storage device (e.g., memory device), for example a solid state drive (SSD), storing a program of instructions, and a processor configured to execute the program of instructions to implement the functionality of one or more, or all, of the foreign substance detecting circuit 120, the application processor 130, the display control circuit, and the power controller 150.

The electronic device 100 may include, in some example embodiments, at least one of a smartphone, a tablet personal computer (PC), a mobile phone, a video phone, an electronic (e)-book reader, a desktop PC, a laptop PC, a netbook computer, a workstation, a server, a personal digital assistant (PDA), a portable multimedia player (PMP), an MP3 player, a mobile medical device, a camera, or a wearable device. According to some example embodiments, the wearable device may include at least one of an accessory-type wearable device (in some example embodiments, a watch, a ring, a bracelet, an anklet, a necklace, glasses, contact lenses, or a head-mounted-device (HMD)), a fabric or clothing integral-type wearable device (in some example embodiments, electronic clothing), a body-attached-type wearable device (in some example embodiments, a skin pad or tattoos), and a bio-implantable-type wearable device (in some example embodiments, an implantable circuit).

According to some example embodiments, the foreign substance detecting circuit 120 may be realized as (e.g., implemented by) an integrated circuit (IC) or included in the IC performing various functions. According to some example embodiments, when the foreign substance detecting circuit 120 is realized as an IC, the foreign substance detecting circuit 120 may further include a processor (e.g., a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.) for controlling general operations of the IC by using hardware and/or software. In some example embodiments, the connector 110 may include a plurality of pins defined in certain specifications, and the foreign substance detecting circuit 120 may include a voltage detecting circuit configured to detect a voltage from at least one pin of the connector 110. That is, when a foreign substance flows into the connector 110, varying resistances (or impedances) may be detected from the at least one pin, according to the type of the foreign substance introduced into the connector 110, and the voltage detecting circuit may detect a voltage, the level of which corresponds to the level of the resistance.

Hereinafter, an operation of detecting a foreign substance will be described according to some example embodiments of the inventive concepts.

The foreign substance detecting circuit 120 may be electrically connected to at least one pin (in some example embodiments, a first pin) of the connector 110, may periodically detect a voltage from the first pin, and may detect the presence of a foreign substance based on the detected voltage. According to some example embodiments, the foreign substance detecting circuit 120 may determine whether an external device is normally connected to the connector 110, or whether there is a foreign substance in the connector 110, based on the level (e.g., magnitude) of the voltage detected from the first pin and a voltage slope detected by using the level of the voltage. The external device may be connected to the connector 110 through a cable. Thus, that the electronic device is connected to the connector 110 may interchangeably denote that an external cable is connected to the connector 110.

In some example embodiments, the foreign substance detecting circuit 120 may include a primary determining device 121 and a secondary determining device 122, wherein the primary determining device 121 may perform a determining operation using the level of the voltage and the secondary determining device 122 may perform a determining operation using the voltage slope. In some example embodiments, the primary determining device 121 may perform the determining operation based on comparison of the detected voltage level with at least one reference level Ref_L and the secondary determining device 122 may perform the determining operation based on comparison of the detected voltage slope with at least one reference value Ref_S. In some example embodiments, the primary and secondary determining devices 121 and 122 may be implemented by a processor executing a program of instructions stored in a non-transitory computer readable storage device.

The foreign substance detecting circuit 120 may perform the operation of detecting the voltage from the first pin at least once and based on the level of the detected voltage, determine whether a foreign substance exists or not (e.g., is present in the connector 110 or not). In some example embodiments, the foreign substance detecting circuit 120 may detect the amount of change (the voltage slope) of the voltage level, based on at least two voltage levels detected from the first pin, and may determine whether the foreign substance exists or not based on the detected voltage slope. As a modified example, the foreign substance detecting circuit 120 may perform the operation of detecting the voltage from the first pin at least twice and may determine whether a foreign substance exists or not based on at least two voltage levels.

The level (e.g., magnitude) of the voltage detected from the first pin may be proportional to an equivalent resistance applied to the first pin. In some example embodiments, when a current having a certain level is applied to the first pin, the level of the voltage detected by the voltage detecting circuit may be proportional to the resistance of the first pin, and thus, the operation of detecting the level of the voltage from the first pin may correspond to an operation of detecting the resistance from the first pin. Restated, the resistance of the first pin may be determined based on detecting the voltage level from the first pin and determining resistance based on the detected voltage level.

As an example of the operation, when the external device is connected to the connector 110, the voltage level detected by the voltage detecting circuit may be within a certain range. In some example embodiments, based on the detected voltage level, it may be determined whether or not a resistance of the first pin is within a resistance range (in some example embodiments, the range around 1 K ohm or the range around 5 K ohm) corresponding to the case in which the external device is connected to the connector 110. Restated, the resistance range may be a particular resistance range that is defined as a range of resistance values of the first pin when the connector 110 is connected to the external device, such that the first pin having a resistance that is within the resistance range is an indication that the connector 110 is connected to the external device. When the resistance of the first pin is within the resistance range, it may be determined that the external device is connected to the connector 110.

However, when there is no foreign substance in the connector 110 or there is a foreign substance having a very large resistance in the connector 110, the voltage level detected from the first pin may be much greater than the voltage level of the case in which the external device is connected to the connector 110. Accordingly, it may be determined that the resistance of the first pin much deviates from the resistance range described above. That is, when the voltage level detected from the first pin is equal to or greater than a certain reference voltage level, the foreign substance detecting circuit 120 may determine that the connector 110 is in an open state or that there is a foreign substance having a relatively large resistance, such as freshwater, in the connector 110.

According to the type of the foreign substance in the connector 110, the resistance detected due to presence of the foreign substance in the connector 110 may be within the aforementioned resistance range corresponding to the case in which the external device is connected to the connector 110 or may be similar to the value of the resistance range. Here, the foreign substance detecting circuit 120 may wrongly determine that the external device is connected to the connector 110, even when the foreign substance exists in the connector 110. Thus, currents may be applied to the first pin for pull up/pull down operations, and thus, the pins in the connector may corrode or be damaged. According to some example embodiments of the inventive concepts, even when the foreign substance detecting circuit 120 determines that the external device is connected to the connector 110 through a first (or a primary) determining operation using the voltage level, the foreign substance detecting circuit 120 may perform a second (or a secondary) determining operation using the voltage slope described above, to accurately determine whether the external device is connected to the connector 110 or a specific type of foreign substance is introduced into the connector 110.

Example operations of the inventive concepts when the foreign substance corresponds to various types of water, such as freshwater, salt water, etc., are described below.

Resistance ranges corresponding to an open state, freshwater, and salt water may be different from one another. The freshwater has a relatively large resistance so that the resistance range corresponding to the freshwater may not overlap the resistance range (in some example embodiments, a normal resistance range) corresponding to the case in which the external device is connected, but the salt water has a relatively small resistance so that the resistance range due to the salt water may overlap the normal resistance range. In some example embodiments, in the case of the USB Type-C structure, the resistance range when the external device is connected may include values according to resistance Rd (5 K ohm) and resistance Ra (1 K ohm). However, the resistance range due to the salt water may include values from about 1 K ohm to about 10 K ohm. Thus, even when the salt water is introduced into the connector 110, it may be wrongly recognized that the external device is connected to the connector 110.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

The secondary determining device 122 may perform the determining operation using the voltage slope detected based on at least two voltage levels. In some example embodiments, water, such as freshwater and salt water, may include a capacitance element along with a resistance element, and thus, when pull up/pull down operations with respect to the first pin are performed when there is salt water in the connector 110, the voltage level may be increased or decreased by having a certain slope based on the charge and discharge characteristics, rather than being increased or decreased sharply. That is, according to some example embodiments of the inventive concepts, when the resistance of the first pin according to the first determining operation is within the normal resistance range described above, the voltage slope may be detected for the second determining operation. In some example embodiments, when, based on comparison of the detected voltage slope with at least one reference value Ref_S (e.g., reference voltage slope value), the amount of change of the voltage level is greater than or equal to the at least one reference value Ref_S, without the charge and discharge characteristics, it may be determined that an external device is connected to the connector 110. However, when the amount of change of the voltage level is less than the at least one reference value Ref_S, based on the charge and discharge characteristics, it may be determined that a specific type of foreign substance is introduced into the connector 110.

The foreign substance detecting circuit 120 may generate the determination result Res_W obtained by determining whether there is a foreign substance in the connector 110 according to some example embodiments. According to some example embodiments, when the foreign substance detecting circuit 120 determines that a foreign substance is introduced, the foreign substance detecting circuit 120 may perform an internal control operation for an additional process corresponding to the determination, including, for example, selectively controlling (e.g., reducing or blocking) the application of electrical power to one or more pins of the connector 110. In some example embodiments, the application processor 130 may control an internal operation of the electronic device 100, including, for example, selectively controlling (e.g., reducing or blocking) the application of electrical power to one or more pins of the connector 110, displaying a particular message or indication on a display of the electronic device 100, etc., based on the determination result Res_W.

According to some example embodiments, the application processor 130 may control the display control circuit 140 based on the determination result Res_W, thereby performing the control operation such that a caution screen is output to indicate the introduction of the foreign substance to a user. In some example embodiments, the power controller 150 may correspond to a power management IC and may selectively control the power supplied to various components in the electronic device 100 based on the determination result Res_W. As an example of the operation, the power controller 150 may be configured to boost the power voltage supplied from an external device during normal operations and may perform the control operation such that the boosting operation is not performed in response to a determination that a foreign substance is present in the connector 110, under control of the application processor 130.

According to some example embodiments of the inventive concepts described above, the foreign substance detecting circuit 120 may accurately determine the presence of a foreign substance, even when the foreign substance having the same or substantially the same resistance range as the external device is introduced. In some example embodiments, the foreign substance detecting circuit 120 may detect the foreign substance based on the resistance range, and thus, may accurately determine the type of the foreign substance. In some example embodiments, the determining operation using the voltage slope may be selectively performed based upon whether the detected voltage level (e.g., magnitude of the detected voltage) satisfies a certain condition, and thus, adding of an unnecessary slope detection operation and an unnecessary determining operation may be reduced or minimized.

The connector 110 may be configured to perform communication based on a universal serial bus (USC) Type-C interface, such that the connector 110 is in a USB Type-C structure. Each of the plurality of pins of the connector 110 may perform a unique function for communication with the external device, and the connector 110 in the USB Type-C structure may include at least one of a configuration channel 1 (CC1) pin and a configuration channel 2 (CC2) pin defined in the USC Type-C interface used to identify the external device. When the external device is connected to the connector 110, any one of the CC1 pin and the CC2 pin may be in a state in connection with the power voltage, and the other of the CC1 pin and the CC2 pin may be in an open state (or a state in connection with a certain pull down resistance). In some example embodiments, the first pin may correspond to any one of the CC1 pin and the CC2 pin. In some example embodiments, the CC pin (the CC1 pin or the CC2 pin) connected to the power voltage may be used as the first pin.

In some example embodiments, the electronic device 100 may include a configuration channel integrated circuit (CCIC) (not shown) configured to recognize the external device according to the voltage or resistance detected from the CC1 pin and the CC2 pin, and the foreign substance detecting circuit 120 may be included in the CCIC. In some example embodiments, a power delivery IC (PDIC) may be provided in the electronic device 100, as an IC for performing the function of the CCIC, and the foreign substance detecting circuit 120 may be included in the PDIC.

Additionally, the electronic device 100 according to some example embodiments of the inventive concepts may be modified in various ways, in addition to the electronic device 100 illustrated in FIG. 1. In some example embodiments, the power controller 150 or one or more components of the power controller 150 may be included in the foreign substance detecting circuit 120. In some example embodiments, when the foreign substance detecting circuit 120 determines that the foreign substance is introduced into the connector 110 based on the voltage detected from the first pin, the foreign substance detecting circuit 120 may perform the control operation of reducing the level of the voltage or the current provided to the connector 110 or blocking the voltage or the current from being provided to the connector 110.

FIG. 1 illustrates the example in which the method of detecting the foreign substance according to some example embodiments of the inventive concepts is implemented by a system, such as a mobile device, etc. However, embodiments of the inventive concepts may be implemented by various types of devices to which the USB type is applied. In some example embodiments, some example embodiments of the inventive concepts may be implemented by a device, such as a charger, etc., including a cable equipped with a plug having the USB Type-C structure, wherein the charger may include the foreign substance detecting circuit 120 according to some example embodiments.

When describing embodiments of the inventive concepts including the connector based on the USB Type-C structure, the meaning of the connector may extend to indicate a component for performing electrical connection between two devices. In some example embodiments, the connector may be referred to as a receptacle to which an external cable is fastened or as a plug inserted into the receptacle. Accordingly, the external device connected to the connector described in some example embodiments of the inventive concepts may correspond to various electronic devices. In some example embodiments, the external device may be defined as a concept to include a charger supporting the USB Type-C structure, various accessories, mobile devices, etc. In addition, the term "pin" described above may be replaced as the term "terminal."

Figure 2:
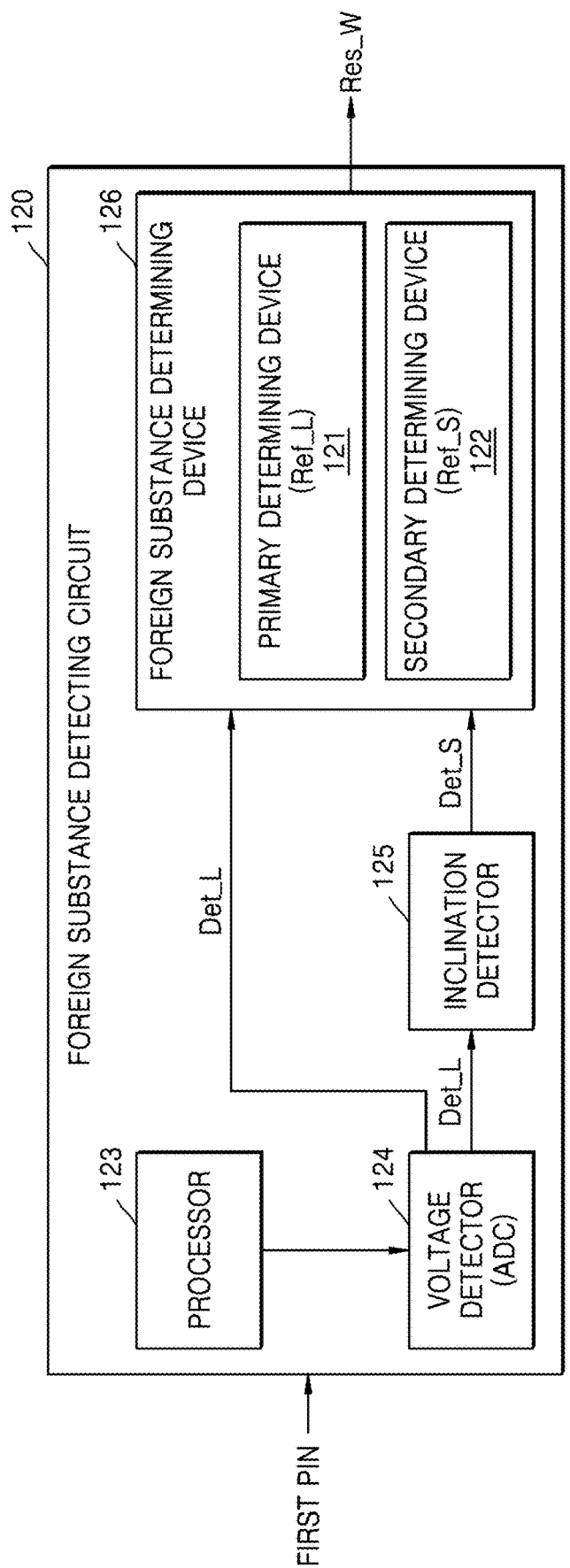
FIG. 2 is a block diagram showing some example embodiments of a foreign substance detecting circuit of FIG. 1 according to some example embodiments of the inventive concepts.

FIG. 2 is a block diagram showing some example embodiments of the foreign substance detecting circuit 120 of FIG. 1. FIG. 2 illustrates an example in which the foreign substance detecting circuit 120 is connected to at least one pin (e.g., the first pin) of the connector 110, and as described above, the first pin may correspond to the CC1 pin or the CC2 pin. However, example embodiments of the inventive concepts are not limited thereto, and the foreign substance detecting circuit 120 may be connected to various types of pins and may detect a voltage.

According to some example embodiments, the foreign substance detecting circuit 120 may include a processor 123, a voltage detector 124, a slope detector 125, and a foreign substance determining device 126. In some example embodiments, the foreign substance determining device 126 may include the primary determining device 121 and the secondary determining device 122.

Referring to FIGS. 1 and 2, the processor 123 may control general operations of the foreign substance detecting circuit 120. In some example embodiments, when the first pin corresponds to the CC1 pin or the CC2 pin, the foreign substance detecting circuit 120 may be included in the CCIC and the processor 123 may control general operations of the CCIC.

The voltage detector 124 may detect the level of a voltage applied to the first pin (e.g., may detect a voltage level from the first pin), and because a resistance of the first pin varies according to the connection of an external device or the introduction of a foreign substance, the level of the voltage detected from the voltage detector 124 may vary. In some example embodiments, the voltage detector 124 may include an analog to digital converter (ADC) and the voltage detector 124 may thus be configured to output (e.g., transmit) a digital signal corresponding to the voltage level detected from the first pin as a first detection result Det_L obtained by detecting the voltage level. The first detection result Det_L may be provided to the slope detector 125 and the foreign substance determining device 126.

The slope detector 125 may receive the first detection result Det_L from the voltage detector 124. In some example embodiments, the slope detector 125 may receive the first detection result Det_L including results obtained by detecting the voltage level at least twice, from the voltage detector 124. In some example embodiments, the slope detector 125 may detect the amount of change of the voltage level, and/or detect a voltage slope indicating same, based on the at least two voltage levels detected from the first pin via the results obtained by detecting the voltage level at least twice, and provide a second detection result Det_S indicating the voltage slope to the foreign substance determining device 126.

The foreign substance determining device 126 may perform a plurality of determining operations to determine whether or not a foreign substance exists (e.g., is present) in the connector 110. In some example embodiments, the primary determining device 121 may determine whether a resistance of the first pin is within a particular resistance range corresponding to the case in which the external device is connected to the connector 110 based on the voltage level Det_L detected from the first pin by the voltage detector 124, for example by comparing the detected voltage level Det_L with at least one reference level Ref_L (e.g., reference voltage level). The aforementioned resistance range that corresponds to a particular external device may be referred to as a "normal" resistance range and/or a particular "first resistance range." When the resistance of the first pin is not within a resistance range that corresponds to an external device, a determination may be made that a foreign substance is present in the connector or that the connector is in an open state. When the resistance of the first pin deviates from a normal resistance range (e.g., is not within the normal resistance range), for example has a value exceeding 10% deviation in magnitude from the at least one reference level Ref_L, and/or when the resistance of the first pin is within a first resistance range that is defined to have a large resistance corresponding to a case in which the connector is in an open state or there is a foreign substance (in some example embodiments, freshwater, etc.) having a very large resistance in the connector 110, it may be determined that the connector 110 is in an open state or that a foreign substance (in some example embodiments, freshwater, etc.) having a very large resistance exists in the connector 110, based on the detected voltage level. On the contrary, when the resistance of the first pin corresponds to the normal resistance range and/or when the resistance of the first pin is within a second resistance range that is defined to have a resistance range corresponding to a resistance range associated with a foreign substance (in some example embodiments, salt water, etc.) having a relatively small resistance in the connector 110, it may be determined that a foreign substance (in some example embodiments, salt water, etc.) having a relatively small resistance exists in the connector 110 or that an external device is connected to the connector 110.

The secondary determining device 122 may determine whether the external device is connected to the connector 110 or the foreign substance exists in the connector 110, based on comparing the voltage slope with at least one reference value Ref_S (e.g., reference voltage slope magnitude). In some example embodiments, when the external device is connected to the connector 110, the voltage level may be sharply changed during a pull up or pull down operation with respect to the first pin, and the voltage slope may have a value corresponding to the change of the voltage level in the pull up or pull down operation. In some example embodiments, according to a time point in which the voltage level is detected, the detected voltage slope may have a very large value or an infinite value. In some example embodiments, when the voltage level is detected at a time point after the voltage is changed, the voltage slope may be 0 or approximate thereto.

However, when a foreign substance, such as salt water, etc., exists in the connector 110, the voltage level may be smoothly changed based on the charge and discharge characteristics due to a capacitance element of the foreign substance, and thus, the voltage slope may be determined to have a value (e.g., slope magnitude) corresponding to the charge and discharge characteristics. Restated, the voltage slope may be determined to have value that corresponds to a capacitance of the foreign substance. In some example embodiments, while the voltage slope has a very large value when the external device is connected to the connector 110, the voltage slope has a relatively small value when there is salt water in the connector 110. That is, even when the resistance ranges corresponding to the salt water and the external device are the same or substantially the same as each other (e.g., the detected resistance of the first pin is within a resistance range corresponding to the external device and/or a resistance range due to salt water), it may be accurately determined whether or not the foreign substance is present in the connector 110, based on the result of determining the magnitude (e.g., level, value, etc.) of the voltage slope. Foreign example, the secondary determining device 122 may compare the voltage slope Det_S with the reference value Ref_S and may determine that the connector 110 is connected with an external device based on a determination that the voltage slope Det_S is equal to or greater than the reference value Ref_S and may determine that a foreign substance is present in the connector 110 based on a determination that the voltage slope Det_S is less than the reference value Ref_S. The foreign substance determining device 126 may output a determination result Res_W obtained by finally determining whether or not a foreign substance is present in the connector 110, based on the first and second determining operations described above.

In some example embodiments, including the example embodiments illustrated in FIG. 2, it is described that the detection of the voltage level, the detection of the voltage slope, and the determination of the foreign substance are performed by separate components. However, this is for describing the operations of the inventive concepts in a separate way according to their functions, and the described detecting and determining operations may be performed in various other ways. In some example embodiments, it is illustrated that the slope detector 125 is provided outside the foreign substance determining device 126. However, example embodiments of the inventive concepts are not necessarily limited thereto, and the slope detector 125 may be included in the foreign substance determining device 126.

It will be understood that the determination of whether the detected resistance of the first pin is within a resistance range corresponding to an external device may include accessing a Look-Up-Table in which various resistance ranges corresponding to various external devices and/or reference voltage levels Ref_L are stored, comparing the detected resistance with the various resistance ranges and/or reference voltage levels Ref_L stored in the Look-Up-Table, and determining that the detected resistance is within a particular resistance range stored in the Look-Up-Table and/or a normal resistance range relating to one or more reference voltage levels Ref_L stored in the Look-Up-Table. The various resistance range values and/or reference voltage levels Ref_L stored in the Look-Up-Table may be determined and populated in various fields of the Look-Up-Table according to well-known experimental methods for determining ranges of resistance at a pin of a connector connected to various external device, including determining a range of detected resistances and/or voltage levels at the first pin while the connector is connected to a known external device and then entering the determined range of detected resistances as a resistance range corresponding to the known external device in the Look-Up-Table and/or entering the detected voltage levels as one or more reference voltage levels Ref_L associated with the known external device in the Look-Up-Table. The Look-Up-Table may be included in a memory that may be included in the electronic device 100, including in a memory that may be included in the one or more instances of processing circuitry 115.

It will be understood that the determination of whether the detected voltage slope has a value that corresponds to charge and discharge characteristics due to a capacitive element of a foreign substance (e.g., value that corresponds to a capacitance of the foreign substance) may include accessing a Look-Up-Table in which various voltage slope values that are known to correspond to charge and discharge characteristics due to capacitive element(s) of one or more foreign substances (e.g., a Look-Up-Table in which various voltage slope values corresponding to various known capacitances of the foreign substance), and/or one or more reference values Ref_S, are stored, comparing the detected voltage slope value (e.g., magnitude) with the various stored known voltage slope values and/or reference values Ref_S, and determining that the detected voltage slope matches a voltage slope value that is stored in the Look-Up-Table and is known to correspond to charge and discharge characteristics due to a capacitive element of a foreign substance (e.g., correspond to a capacitance of the foreign substance) and/or determining that the detected voltage slope is greater than, is equal to, or is less than one or more reference values Ref_S stored in the Look-Up-Table. The various voltage slope values and/or reference values Ref_S stored in the Look-Up-Table may be determined and populated in various fields of the Look-Up-Table according to well-known experimental methods for determining voltage slope of voltages detected at a pin of a connector in which various foreign substances are present, including determining a voltage slope of voltages detected at the first pin while a known foreign substance is present in the connector and then entering the determined voltage slope value in the Look-Up-Table as corresponding to charge and discharge characteristics due to capacitive element(s) of the known foreign substance. The Look-Up-Table may be included in a memory that may be included in the electronic device 100, including in a memory that may be included in the one or more instances of processing circuitry 115.

In some example embodiments, operations of various function blocks illustrated in FIG. 2 may be implemented by a hardware circuit or based on software. In some example embodiments, at least some of the operations of determining the foreign substance according to some example embodiments of the inventive concepts may be implemented by software, and in this case, various instructions may be stored in a certain storage circuit (not shown) in the foreign substance detecting circuit 120 and the processor 123 may execute the instructions to perform the described operations.

The operations of determining the presence of the foreign substance by determining the voltage slope according to some example embodiments described above (e.g., the second determining operation) may be selectively performed to accurately re-identify whether the external device is connected, in response to a determination that the resistance of the first pin is within the resistance range corresponding to the external device and/or is equal to or greater than a particular reference voltage level (e.g., as determined in the first determining operation). In some example embodiments, these operations may be performed based on general control operations of the processor 123.

In some example embodiments, the first determining operation and/or the second determining operation may be performed in each of a pull up operation and a pull down operation with respect to the first pin.

The condition in which the determining operation using the voltage slope is performed according to some example embodiments of the inventive concepts may be set to vary. In some example embodiments, assuming that the resistance range when the external device is connected corresponds to a certain range (in some example embodiments, a first resistance range) based on 1 K ohm or a certain range (in some example embodiments, a second resistance range) based on 5 K ohm, the determining operation using the voltage slope may be performed, when the resistance of the first pin corresponds to the first resistance range or the second resistance range, based on the detected voltage level. In some example embodiments, a resistance range (in some example embodiments, a third resistance range) encompassing the first resistance range and the second resistance range and greater than the first resistance range and the second resistance range may be defined, and the determining operation using the voltage slope may be performed when the resistance of the first pin corresponds to the third resistance range. In some example embodiments, the resistance range corresponding to salt water may be defined as about 1 K ohm to about 10 K ohm. The determining operation using the voltage slope may be performed when the resistance of the first pin is within the range that is about 1 K ohm to about 10 K ohm.

Figure 3:
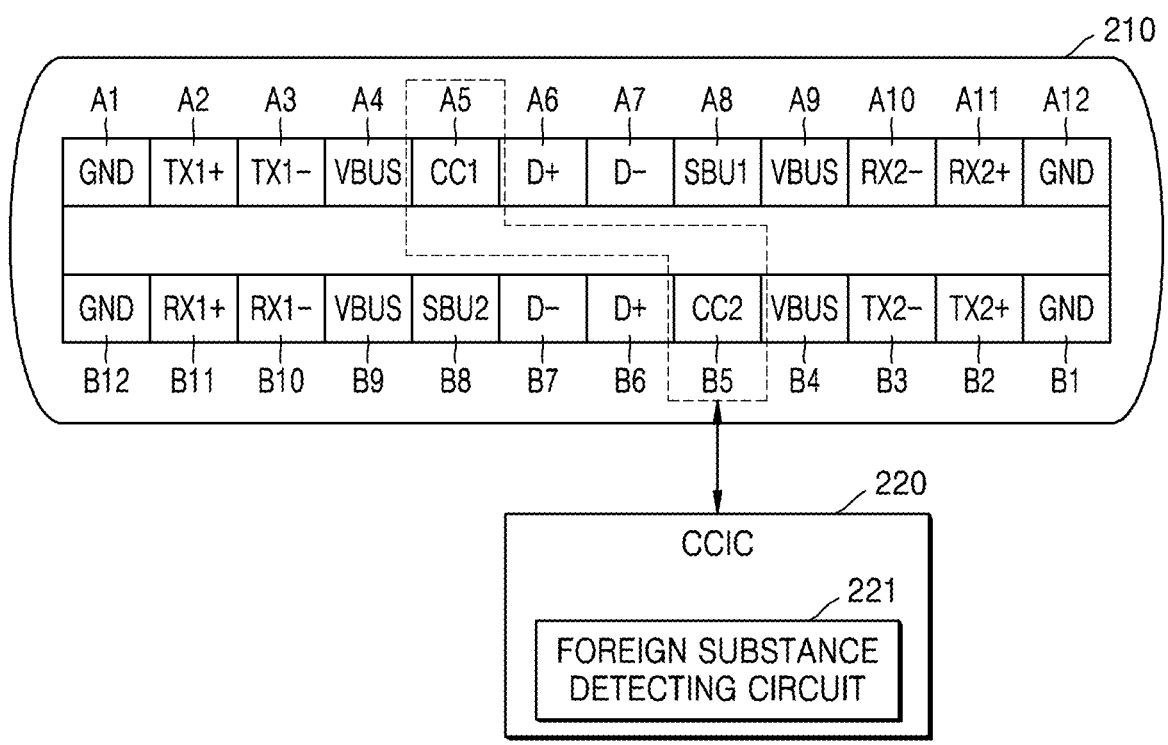
FIG. 3 is a view showing an example in which a connector having a universal serial bus (USB) Type-C structure is applied as a connector according to some example embodiments of the inventive concepts.

FIG. 3 is a view showing an example in which a connector 210 having a USB Type-C structure is applied as a connector according to some example embodiments of the inventive concepts. The terms described in FIG. 3 may be easily understood by one of ordinary skill in the art based on the USB specifications, and thus, their detailed descriptions will be omitted.

Referring to an electronic device 200 of FIG. 3, pins of the connector 210 having the USB Type-C structure may have a symmetric structure. That is, when a cable or a sender (e.g., transmitter, communication channel, etc.) is connected with the connector 210 having the USB Type-C structure of the electronic device 200, the cable or the sender (e.g., transmitter, communication channel, etc.) may be connected with the connector 210 having the USB Type-C structure, regardless of the directionality, based on the symmetric structure. In some example embodiments, the connection may be achieved without making the USB cable correspond to the directionality of the pins.

The connector 210 may include pins in two rows. In some example embodiments, the connector 210 may include pins A1 through A12 in a first row and pins B1 through B12 in a second row and may support data communication of various speeds. In some example embodiments, the connector 210 may include the pins A2 and A3, A10 and A11, B2 and B3, and B10 and B11 configured to support high speed data communication based on the first standards (in some example embodiments, USB 3.1) and the pins A6 and A7 and B6 and B7 configured to support low speed data communication based on the second standards (in some example embodiments, USB 2.0). In addition, each of the pins A1 through A12 of the first row and the pins B1 through B12 of the second row may perform its unique function. In some example embodiments, VBUS pins A4, A9, B4, and B9 may correspond to power supplying pins, GND pins A1, A12, B1, and B12 may correspond to pins configured to transmit the ground voltage, and sideband use (SBU) pins A8 and B8 may be used to support an alternate (ALT) mode and may be connected with a cable equipped with Thunderbolt, DisplayPort, HMDI, etc.

A device in which the connector 210 is implemented may perform bi-directional communication. In some example embodiments, the electronic device 200 described above may operate as a host (in some example embodiments, a downstream facing port (DFP)) or as a slave (in some example embodiments, an upstream facing port (UFP)) when the electronic device 200 is connected to an external device via a USB interface. In some example embodiments, the electronic device 200 described above may operate as a dual role port (DRP) and the electronic device 200 may adaptively change the function of the host DFP or the device UFP.

The function of the electronic device 200 described above may be designated via the CC pins A5 and B5 of the connector 210 having the USB Type-C structure. In some example embodiments, in the case of the USB interface, data connection and control may be performed by digital communication through the CC1 and CC2 pins A5 and B5.

According to the model of the electronic device 200, only some of the plurality of pins of the connector 210 may be used. In some example embodiments, some of the models may not use more than one GND pins from among the plurality of GND pins A1, A12, B1, and B12. In some example embodiments, some of the models may not use at least one of the pins A2, A3, A10, A11, B2, B3, B10, and B11 related to the high speed data communication. The pins that are not used in the electronic device 200 may not be electrically connected to the IC in the electronic device 200 related to the communication. According to some example embodiments of the inventive concepts, when the pins not used in the electronic device 200 are set as the first pin described above, a foreign substance detecting circuit for detecting a foreign substance through the first pin may be additionally included. In some example embodiments, when the pins actually used in the electronic device 200 are set as the first pin described above, the electronic device 200 may be realized in the form in which a foreign substance detecting circuit is included in the IC connected to the first pin.

The electronic device 200 may include a CCIC 220 connected to the CC1 and CC2 pins A5 and B5, and when the first pin described above corresponds to the CC1 pin A5 or the CC2 pin B5, a foreign substance detecting circuit 221 may be included in the CCIC 220. The foreign substance detecting circuit 221 may detect a voltage level from the CC1 pin A5 or the CC2 pin B5, based on a connection state of the connector 210, may detect a voltage slope based on the detected voltage level, and may determine the presence of a foreign substance in the connector 210 based on the detected voltage slope.

Figure 4:
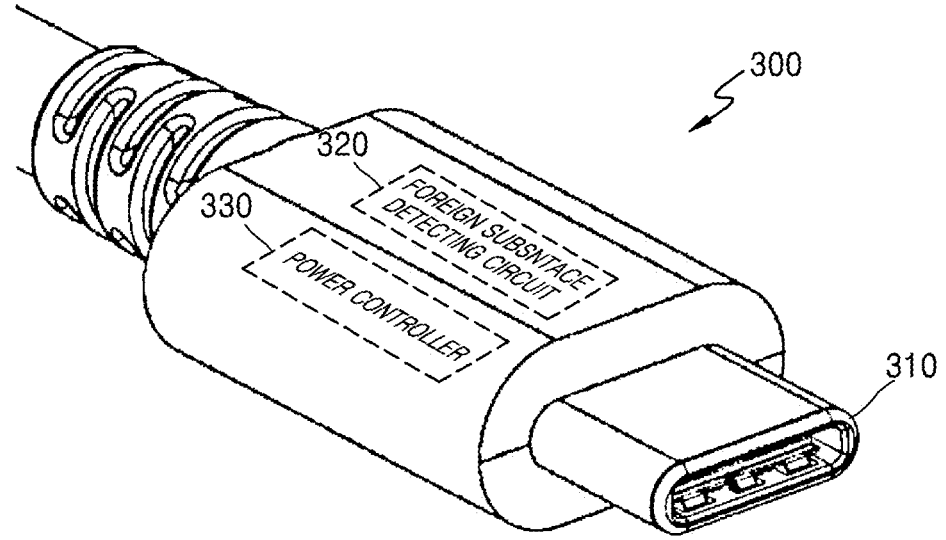
FIG. 4 is a view showing an example in which a method of detecting a foreign substance, according to some example embodiments of the inventive concepts, is applied to a charger.

FIG. 4 is a view showing an example in which a method of detecting a foreign substance according to some example embodiments of the inventive concepts is applied to a charger 300.

Referring to FIG. 4, a device, such as the charger 300, etc., may include a connector having a USB Type-C structure. In some example embodiments, the charger 300 may include a plug 310 including a plurality of pins based on the USB Type-C structure and a foreign substance detecting circuit 320 connected to at least one pin (in some example embodiments, a CC1 pin and/or a CC2 pin) of the plug 310 and performing the operation of detecting the foreign substance according to some example embodiments described above. In some example embodiments, the charger 300 may further include a power controller 330 configured to control a charging operation by controlling an operation of providing power to a system of a mobile device, etc.

The foreign substance detecting circuit 320 may determine whether there is a foreign substance in the plug 310 based on the determining operation using the voltage level and the voltage slope according to some example embodiments described above, and based on a result of the determination, the power controller 330 may selectively control the power supplying operation. In some example embodiments, the foreign substance detecting circuit 320 may periodically identify whether or not an external device is connected (or whether or not a foreign substance is present) and when the external device is normally connected, may supply a power voltage to the external device. Here, when it is wrongly determined that the external device is normally connected even when a foreign substance, such as salt water, etc., is present in the plug 310, the power voltage may be supplied to the external device through the plug 310 so that the pins may corrode or be damaged. However, according to some example embodiments of the inventive concepts, the operation of detecting the foreign substance may be accurately performed, and thus, corrosion and damage to the pins may be reduce or prevented.

In addition to some example embodiments described above, other some example embodiments to be described hereinafter may be applied to the charger 300 illustrated in FIG. 4 in the same or substantially the same manner.

Figure 5:
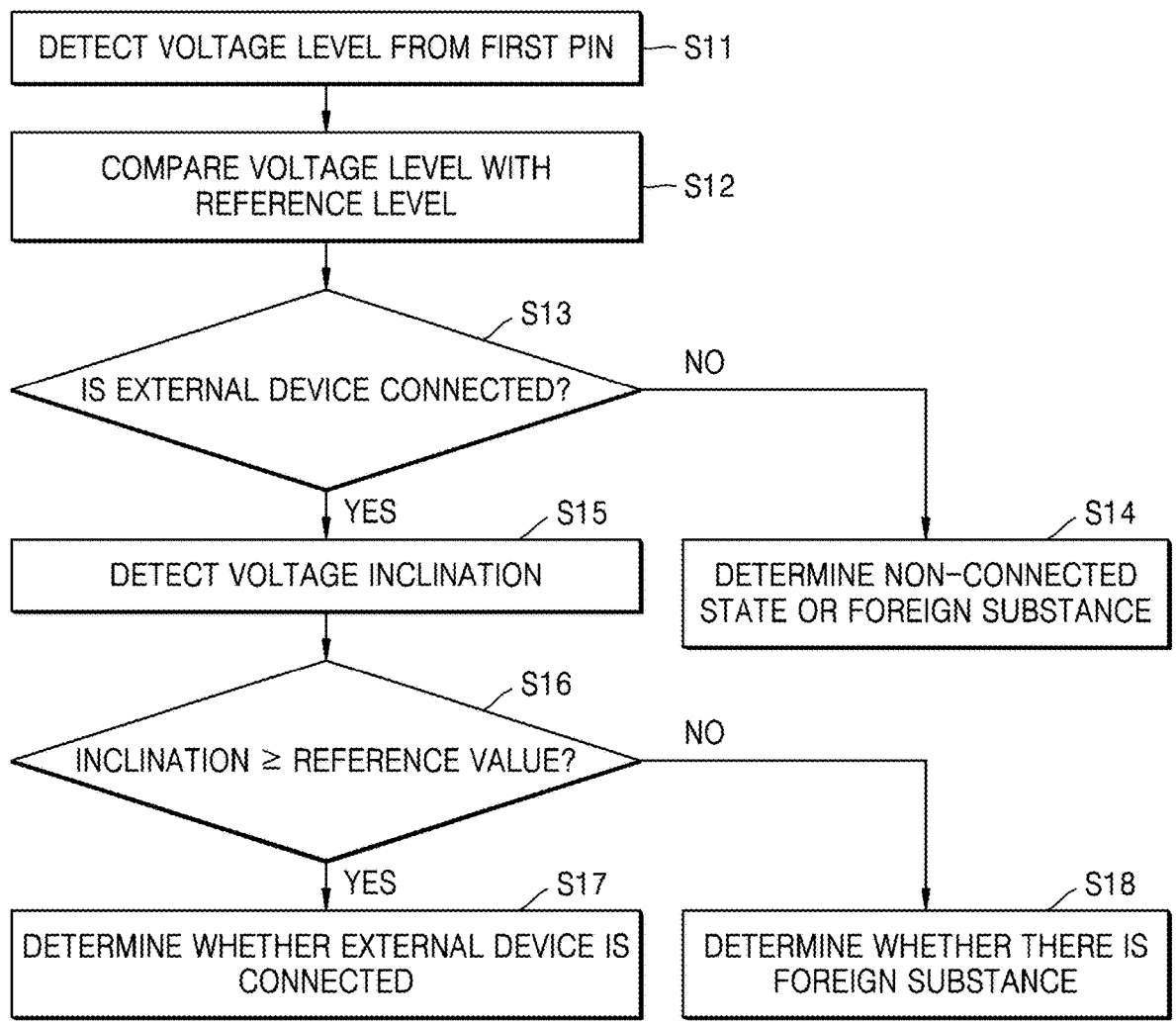
FIG. 5 is a flowchart of a method of detecting a foreign substance, according to some example embodiments of the inventive concepts.

FIG. 5 is a flowchart of a method of detecting a foreign substance, according to some example embodiments of the inventive concepts. FIG. 5 describes an example of an operation of an electronic device, such as a mobile device, etc. However, components related to a method of detecting a foreign substance from among components illustrated in FIG. 5 may also be applied to devices, such as the charger, etc., described above.

Referring to FIG. 5, the electronic device may include a connector having a USB Type-C structure and may detect a voltage level from a first pin from among a plurality of pins of the connector (S11). The voltage level detected from the first pin may be changed according to a change of a resistance applied to the first pin. The detected voltage level may be compared with at least one reference level (S12) and whether the resistance of the first pin corresponds to a certain resistance range corresponding to an external device may be determined based on a result of the comparison, in order to determine whether the external device is connected to the connector (S13).

When the external device is connected to the connector, a resistance having a certain level defined in the USB Type-C structure is connected to the first pin of the connector and the voltage level detected from the first pin may have a relatively small value. In contrast, when the connector is in an open state or a foreign substance having a resistance of a very high level is present in the connector, the voltage level detected from the first pin may have a relatively very large value. According to a result obtained by comparing the detected voltage level with at least one reference voltage level, when the detected voltage level is equal to or greater than the at least one reference voltage level, it may be determined that the connector is not connected to an external device (e.g., is in an open state) or a foreign substance having a high resistance, such as freshwater, etc., is present in the connector (S14). When the detected voltage level is less than the at least one reference voltage level, it may be determined that the external device is connected to the connector or that a foreign substance is present in the connector. In response to a determination that 1) the detected voltage level is less than the reference voltage level and 2) the resistance of the first pin is not within a first resistance range that corresponds to connection of the connector with an external device, a determination may be made that a foreign substance (e.g., salt water) is in the connector based on the detected voltage level.

In some example embodiments, when it is determined that the external device is connected to the connector (or a foreign substance is present in the connector) based on the voltage level detected from the first pin (e.g., the voltage level indicating that a resistance of the first pin is within a first resistance range corresponding to at least the external device being connected to the connector), the electronic device may detect a voltage slope based on the voltage level detected at least two times, in order to determine again whether the external device is connected to the connector based on a determination of whether the voltage slope satisfies a certain condition (S15). For example, according to the type of the foreign substance present in the connector, a resistance range due to the foreign substance may overlap a resistance range of the case in which the external device is connected, and a voltage slope and a certain reference value may be compared with each other to determine whether a voltage change in pull up/pull down operations has charge and discharge characteristics (S16). When the external device is connected to the connector, there may be no voltage slope or the voltage slope may have a very large value according to a time point at which the voltage level is detected. When it is defined that the voltage slope has a very large value when the external device is connected, it may be determined that the external device is connected to the connector and no foreign substance is present in the connector when the voltage slope is equal to or greater than the reference value (S17). In contrast, when the voltage slope is less than the reference value, it may be determined that the foreign substance is present in the connector (S18). Restated, in response to a determination that 1) the detected voltage level is less than the reference voltage level and/or 2) the resistance of the first pin is within a first resistance range that corresponds to connection of the connector with an external device, a determination of whether the external device is connected to the connector or a foreign substance (e.g., salt water) is in the connector may be made based on determining whether the voltage slope is equal to or greater than the reference voltage slope value: if the voltage slope is equal to or greater than the reference voltage slope value, the external device may be determined to be connected to the connector; if the voltage slope is less than the reference voltage slope value, a foreign substance (e.g., salt water) may be determined to be in the connector.

According to some example embodiments of the inventive concepts described above, a foreign substance having a relatively large resistance may be determined based on a result of determining the voltage level and a foreign substance having a relatively small resistance may be determined based on a result of determining the voltage slope. Here, the resistance ranges of various types of foreign substances may be defined and capacitance elements of the various types of foreign substances may be defined to determine the types of foreign substances based on the determining operations using the voltage level and the voltage slope described above. In some example embodiments, the electronic device may be realized such that under control of a power controller and an application processor provided in the electronic device, a power control operation is performed in a different way or a display operation of the display is performed in a different way, depending on the type of the foreign substance. For example, as shown in FIG. 5, when it is determined at S17 that the external device is connected to the connector and no foreign substance is present in the connector, one or more operations associated with an electronic device in which the connector 110 is included and/or one or more operations associated with one or more pins of the connector 110 may be performed (S19), including, for example, applying electrical power to one or more pins of the connector 110 in accordance with one or more operations (e.g., a pull up and/or pull down operation). In contrast, when it is determined at S18 that the foreign substance is present in the connector, one or more operations associated with an electronic device in which the connector 110 is included and/or one or more operations associated with one or more pins of the connector 110 may be adjusted or canceled (S20), including, for example, decreasing or blocking the application of electrical power to one or more pins of the connector 110 in accordance with adjusting or blocking one or more operations (e.g., a pull up and/or pull down operation), to reduce or prevent corrosion of the connector or damage to the circuit device. Thus, said one or more operations may be selectively and/or adjustably performed, which may include selectively controlling application of electrical power and/or voltage to one or more pins of the connector, (and current may thus be selectively and/or adjustably directed to pass through one or more pins of the connector) based upon whether it is determined that a foreign substance is present in the connector. Accordingly, performance of the electronic device (e.g., a computing device) and/or mitigation of damage, corrosion, etc. to the electronic device may be improved.

It will be understood that each of the operations illustrated in FIG. 5 and described herein with reference to FIG. 5 may be performed by one or more elements of the electronic device 100.

Figure 6A:
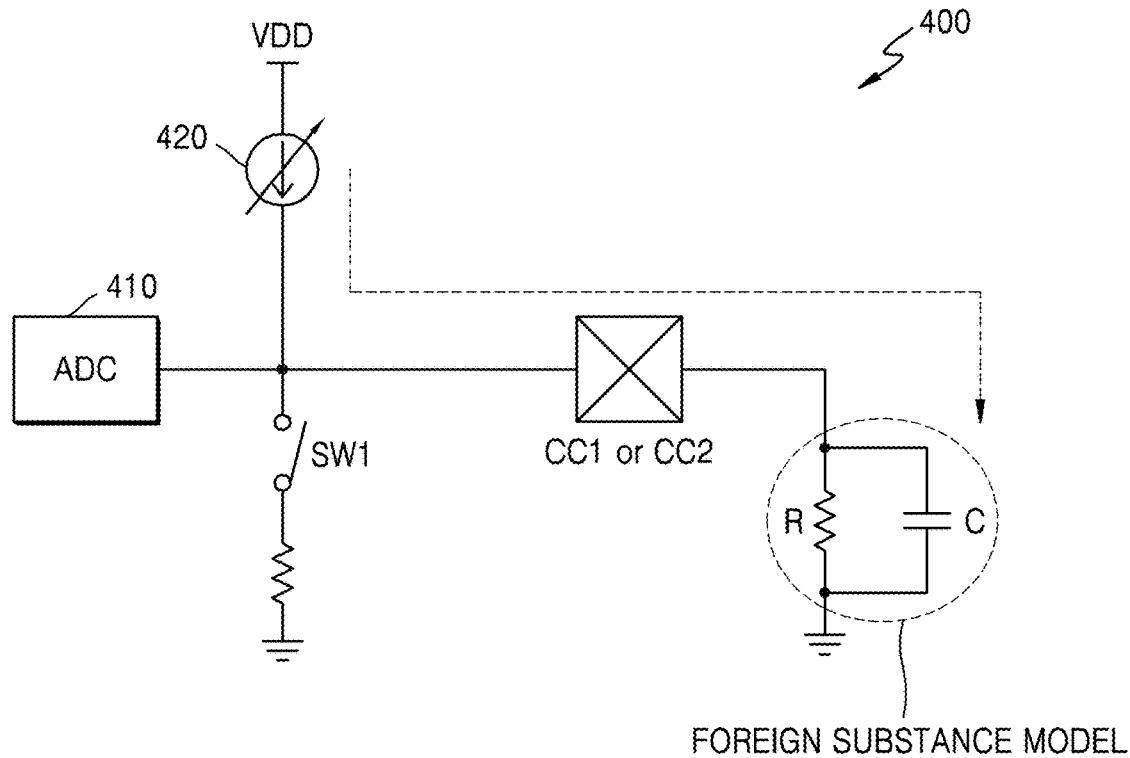
FIGS. 6A and 6B are equivalent circuit diagrams showing a connection state of a first pin of a connector according to some example embodiments of the inventive concepts.
Figure 6B:
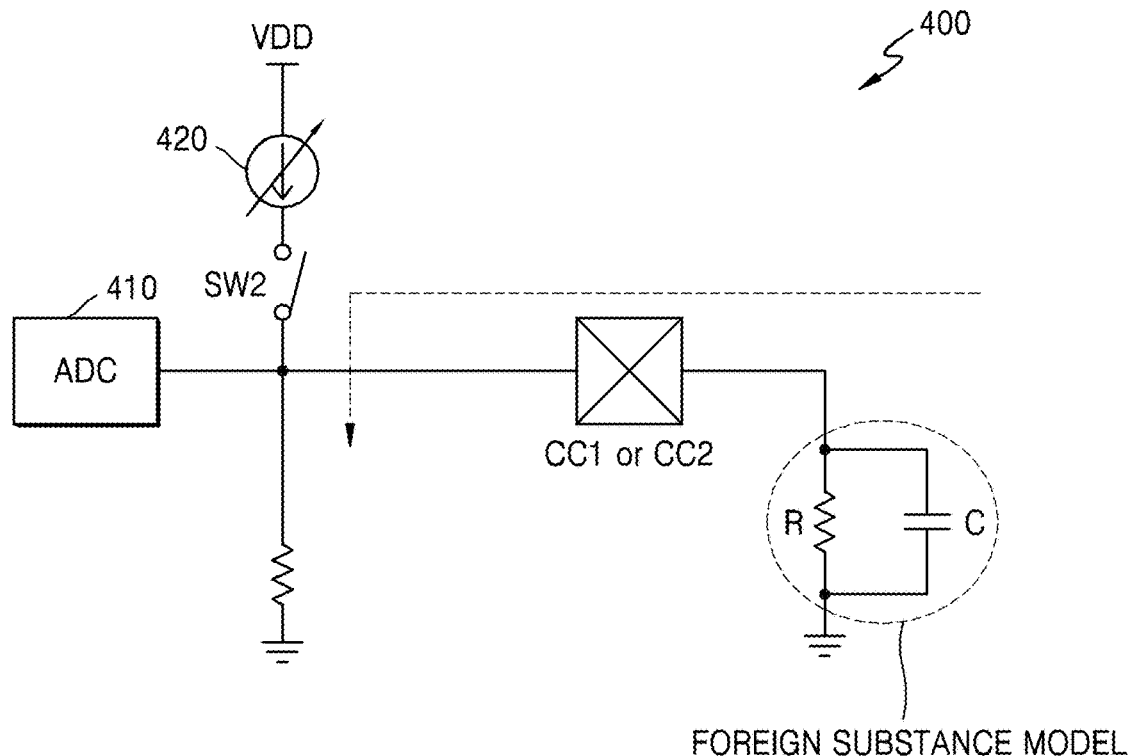

FIGS. 6A and 6B are equivalent circuit diagrams showing a connection state of a first pin of a connector. FIGS. 6A and 6B illustrate a case in which a CC1/CC2 pin is set as the first pin according to some example embodiments of the inventive concepts. Here, the first pin may correspond to the CC1 pin or the CC2 pin according to a connection state (in some example embodiments, a connection direction) of a cable.

Referring to FIGS. 6A and 6B, an electronic device 400 may include a current source 420 for a pull up operation with respect to the first pin and may include an ADC 410 configured to detect a voltage level from the first pin. In some example embodiments, a first switch SW1 and a second switch SW2 may be provided for controlling pull up/pull down operations. As the second switch SW2 is turned on during the pull up operation, currents may flow in a direction 601 illustrated in FIG. 6A and as the first switch SW1 is turned on during the pull down operation, currents may flow in a direction 602 illustrated in FIG. 6B. For convenience of explanation, FIGS. 6A and 6B illustrate only the pull down resistance and do not illustrate the pull up resistance. However, it may be understood by one of ordinary skill in the art that the pull up resistance for the pull up operation may further be included in the USB Type-C connector structure.

A circuit model connected to the first pin may be different between the case when an external device is connected to the connector and no foreign substance is present in the connector and the case when a foreign substance is present in the connector. In some example embodiments, when the foreign substance is present in the connector, the circuit model connected to the first pin may be defined to include a resistance R and a capacitor C. The values of the resistance R and the capacitor C may vary depending on the type of the foreign substance and the voltage level detected from the first pin may be changed according to the value of the resistance R. In some example embodiments, a time constant T may be defined as a parameter due to the resistance R and the capacitor C, and the time constant T may be changed according to the type of the foreign substance, and thus, the amount of change (or a voltage slope) of the voltage during the pull up operation and the pull down operation may be differently detected based on the type of the foreign substance.

The first pin may be connected to a power voltage VDD through a pull up circuit and may be connected to a ground voltage through a pull down circuit. In some example embodiments, according to the connection state illustrated in FIG. 6A, currents from the current source 420 may flow into the foreign substance model through the first pin and the ADC 410 may provide the detection result at least two times to detect the voltage level and the voltage slope during the pull up operation. In some example embodiments, currents may flow from the foreign substance model to the ground voltage through the first pin according to the connection state illustrated in FIG. 6B and the ADC 410 may provide the detection result at least two times to detect the voltage level and the voltage slope during the pull down operation.

Figure 7:
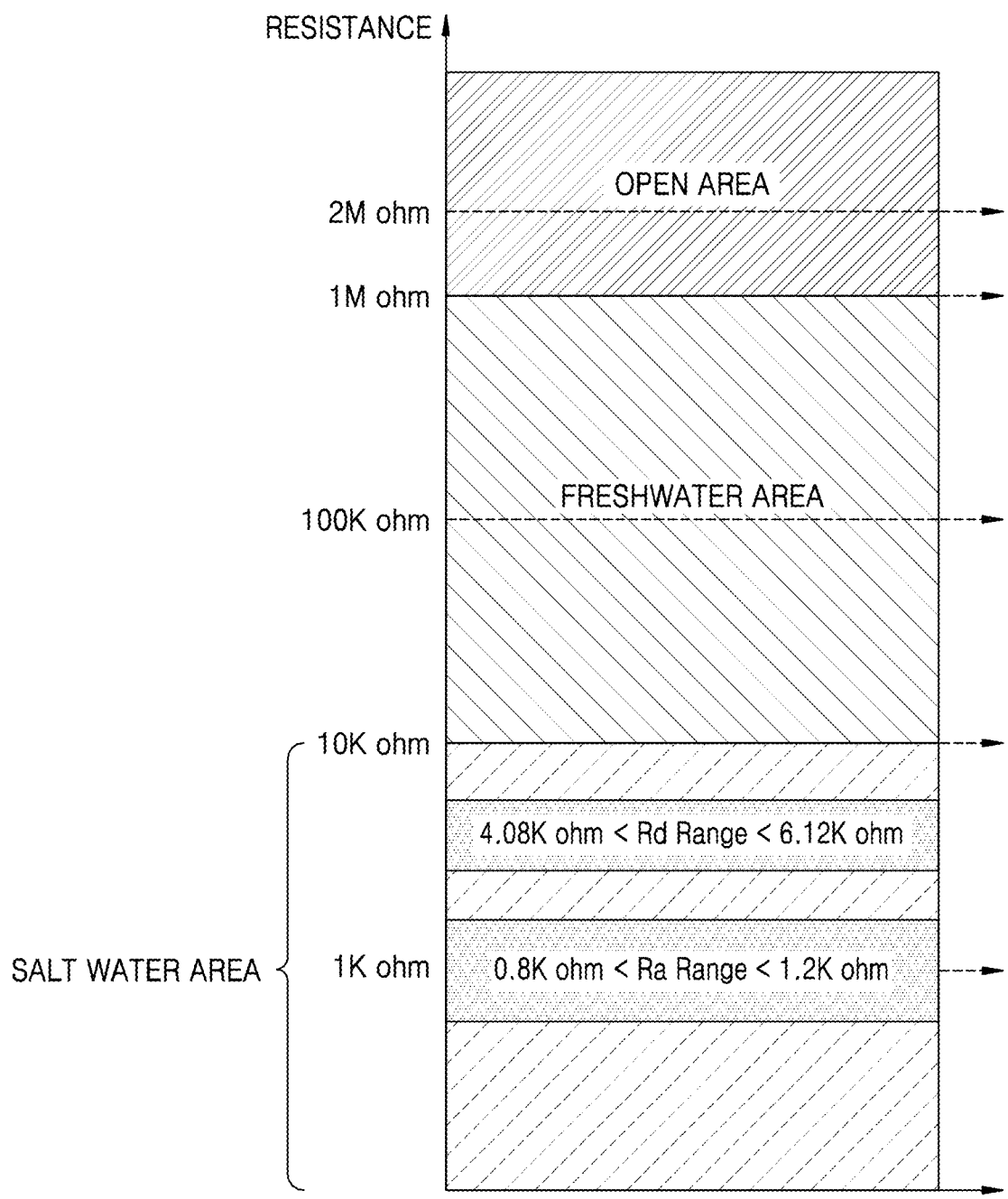
FIG. 7 is a conceptual view showing an example of a resistance range of water as a foreign substance according to some example embodiments of the inventive concepts.

FIG. 7 is a conceptual view showing an example of a resistance range of water, as a foreign substance according to some example embodiments of the inventive concepts.

Referring to FIG. 7, resistance ranges of various levels may be defined and when an external device is connected to a connector, the resistance range due to certain resistances Rd and Ra in a USB Type-C structure may be defined. In some example embodiments, in the case of a CC1 pin, when the external device is connected to the connector based on the USB Type-C structure, the resistance Rd or the resistance Ra may be connected to the CC1 pin, wherein the resistance Rd may have a resistance range of about 4.08 K ohm through about 6.12 K ohm and the resistance Ra may have a resistance range of about 0.8 K ohm through about 1.2 K ohm. However, the numerical values described above are only examples and the values of the resistance Rd and the resistance Ra may be slightly modified within the range meeting the USB Type-C specifications.

An electronic device performing communication based on the USB Type-C specifications may be already aware of the resistance range defined by the resistance Rd and the resistance Ra, and thus, may determine that an external device is connected to the connector when the resistance of the CC1 pin corresponds to the resistance range due to the resistance Rd and the resistance Ra, based on the voltage level detected from the CC1 pin. In contrast, when the electronic device determines that the resistance of the CC1 pin does not correspond to the resistance range defined above based on the voltage level detected through the CC1 pin, the electronic device may determine that a foreign substance, freshwater, or salt water is present in the connector. When the foreign substance, freshwater, or salt water is present in the connector, the pull up operation with respect to the CC1 pin may be canceled to reduce or prevent corrosion of the connector or damage to the circuit device.

A foreign substance having a relatively large resistance, such as freshwater, etc., may exist in the connector, and the resistance range corresponding to the fresh water may be defined to be between 10 K ohm and 1 M ohm. In contrast, when there is no foreign substance in the connector or the external device is not connected, the CC1 pin may have an open state and the resistance range of the open state may be defined to be equal to or greater than 1 M ohm. Accordingly, when the resistance of the CC1 pin is greater than the resistance range corresponding to the external device based on the voltage level detected from the CC1 pin, it may be determined that the connector is in an open state or a foreign substance having a large resistance is present in the connector.

A foreign substance having a relatively small resistance, such as salt water, etc., may be introduced into the connector, and the resistance range corresponding to the salt water may be defined to be between 0 K ohm and 10 K ohm. Here, the resistance range of the resistances Rd and Ra described above may be included in the resistance range of salt water. Accordingly, even when the voltage level corresponding to the resistance range of the resistances Rd and Ra is detected from the CC1 pin, this may be due to the foreign substance, such as salt water, etc., rather than due to the connection of the external device. That is, when there is a foreign substance having a small resistance, such as salt water, etc., in the connector, the electronic device may wrongly determine that the external device is connected and may perform pull up and pull down operations with respect to the CC1 pin.

According to some example embodiments of the inventive concepts, when the voltage level corresponding to the resistance range of the resistances Rd and Ra is detected from the CC1 pin, a voltage slope may be detected to re-determine whether the external device is actually connected to the connector. In some example embodiments, as described in some example embodiments, in the pull up operation with respect to the CC1 pin, the voltage level may be detected at least two times and the voltage slope may be detected based results thereof. In some example embodiments, in the pull down operation with respect to the CC1 pin, the voltage level may be detected at least two times and the voltage slope may be detected based on results thereof. In some example embodiments, the detected voltage slope may be compared with at least one reference value and when the voltage slope is greater than the reference value, it may be determined that the external device is connected to the connector, and when, in contrast, the voltage slope is less than the reference value, it may be determined that there is the foreign substance in the connector.

With respect some example embodiments, including the example embodiments illustrated in FIG. 7, it is described that the operation of determining the foreign substance by using the voltage slope is selectively performed when the resistance of the CC1 pin that is detected based on the voltage level corresponds to the resistance range of the resistances Rd and Ra. However, embodiments of the inventive concepts are not limited thereto. In some example embodiments, when the resistance detected from the CC1 pin has a value within the resistance range (in some example embodiments, 1 K ohm through 10 K ohm) corresponding to salt water, the determining operation using the voltage slope may be performed to accurately determine whether there is a foreign substance in the connector or an external cable is connected to the connector.

Figure 8:
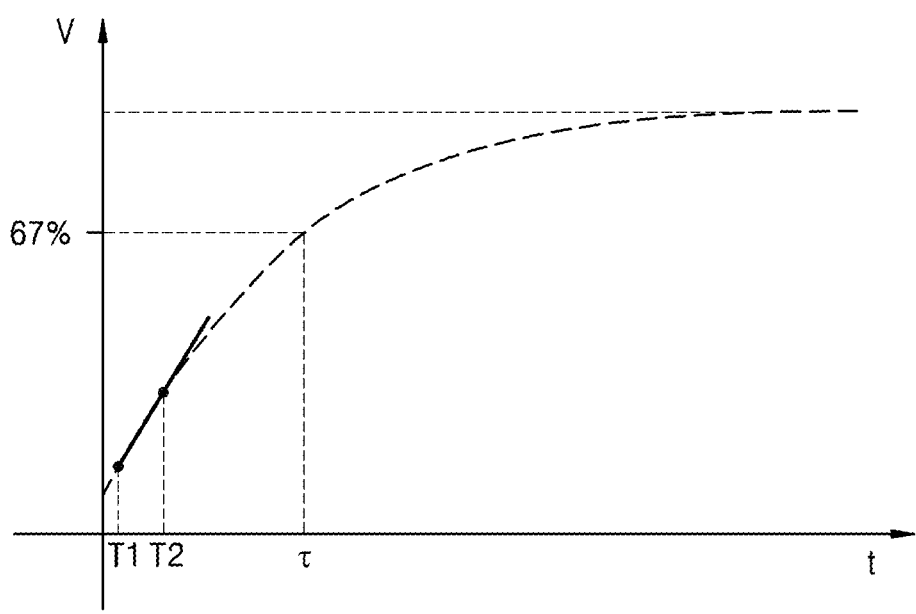
FIG. 8 is a graph showing an example of two time points selected to detect a voltage slope according to some example embodiments of the inventive concepts.

FIG. 8 is a graph showing an example of two time points selected to detect a voltage slope according to some example embodiments of the inventive concepts. FIG. 8 illustrates the example of the two time points selected in a pull up operation. However, two time points may also be set in the pull down operation in the same or substantially the same manner to detect the voltage slope.

When a foreign substance is introduced, a foreign substance model including a resistance R and a capacitor C may be connected to the CC1 pin and a time constant ($\tau$=RC) may be defined according to the values of the resistance R and the capacitor C. The voltage level at a time point corresponding to the time constant ($\tau$=RC) may be increased to about 67% of the maximum value in the pull up operation, and the voltage level detected through the CC1 pin may show a great change in a section before the time constant ($\tau$=RC) according to the type of the foreign substance existing in the connector.

According to some example embodiments of the inventive concepts, at least two time points may be selected in the section before the time constant ($\tau$=RC). In some example embodiments, the voltage level may be detected from the CC1 pin in a first time point T1 and a second time point T2 and the voltage slope may be detected based on the detected voltage levels. In some example embodiments, when a foreign substance having a large time constant ($\tau$=RC), such as salt water, etc., is introduced, the voltage slope having a relatively small value may be detected. However, when the external device is connected, the voltage slope having a very large value may be detected because the change of voltage level does not have the charge and discharge characteristics. Accordingly, even when the resistance range corresponding to the external device and the resistance range corresponding to the salt water overlap each other, the case of the salt water and the case of the external cable may be accurately determined.

The voltage slope may be used to determine other various types of foreign substances, according to some example embodiments of the inventive concepts. In some example embodiments, when freshwater having a smaller time constant ($\tau$=RC) than salt water is introduced into the connector, the voltage slope may have a relatively larger value than the voltage slope of the salt water and may have a relatively smaller value than the voltage slope of the case in which the external device is connected. The changes of the voltage levels in the pull up and pull down operations with respect to various types of foreign substances having different time constants ($\tau$=RC) may be defined, information thereof may be stored in the electronic device, etc., and various determining operations related to the presence of the foreign substance and the type of the foreign substance may be performed by detecting the voltage slope according to some example embodiments.

Figure 9A:
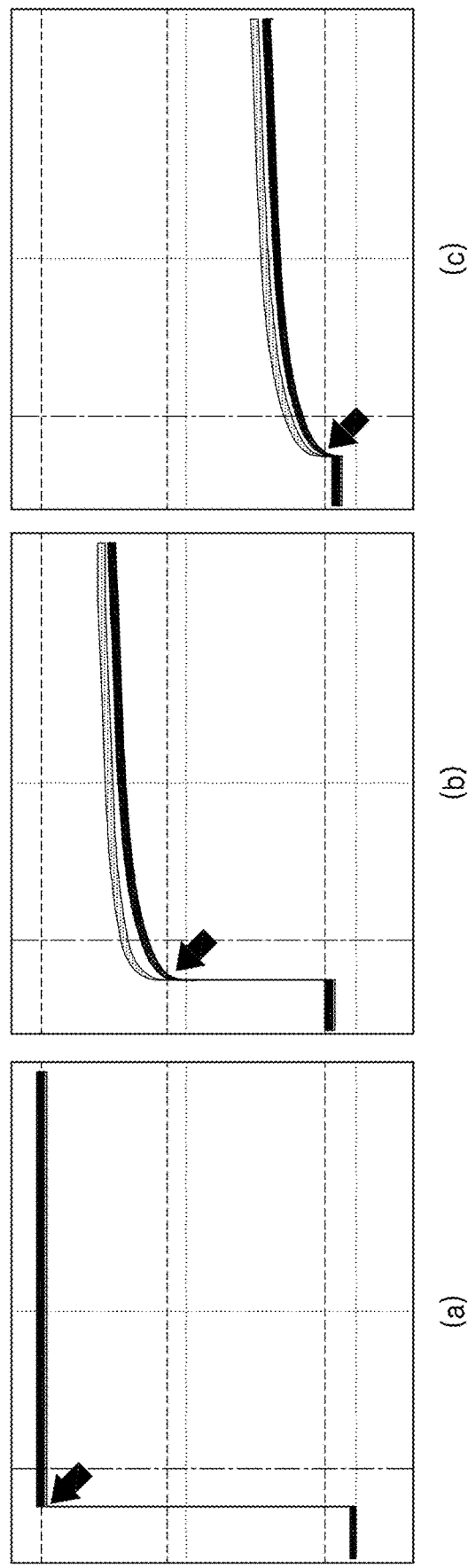
FIGS. 9A, 9B, and 9C are graphs showing examples of voltage levels detected from a configuration channel 1 (CC1) pin according to various states of a connector according to some example embodiments of the inventive concepts.
Figure 9B:
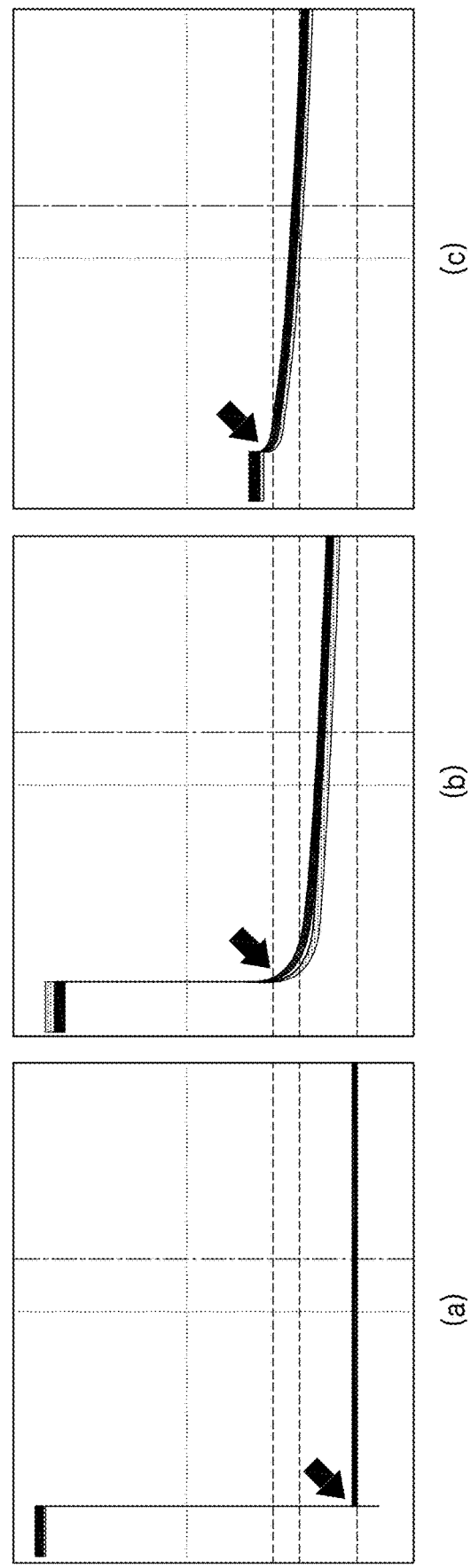
Figure 9C:
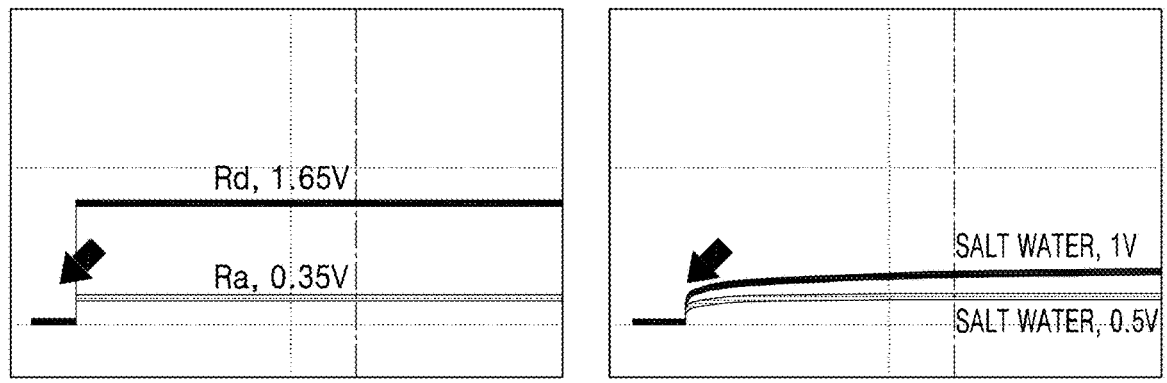

FIGS. 9A, 9B, and 9C are graphs showing examples of voltage levels detected from a CC1 pin according to various states of a connector according to some example embodiments of the inventive concepts. FIG. 9A illustrates examples of changes in the voltage levels in a pull up operation in an open state, in a state in which freshwater is introduced, and in a state in which salt water is introduced. FIG. 9B illustrates examples of changes in the voltage levels in a pull down operation in the open state, in the state in which freshwater is introduced, and in the state in which salt water is introduced. In the example of FIG. 9C, the changes in the voltage levels in the pull up operation when the external device is connected and when the salt water is introduced are illustrated. In some example embodiments, in the graphs illustrated in FIGS. 9A, 9B, and 9C, thick lines indicate a voltage level of a CC pin connected to a resistance Rd and broken lines indicate a voltage level of a CC pin connected to a resistance Ra.

Referring to the examples in the pull up operation in FIG. 9A, the resistances of the CC1 pin may be greatly different from one another in the open state, in the state in which fresh water is introduced, and in the state in which salt water is introduced. As shown in (a) of FIG. 9A, the level of the power voltage may be detected in the open state without the pull up operation. In some example embodiments, the voltage level detected in the state in which freshwater is introduced as shown in (b) of FIG. 9A may be greatly different from the voltage level detected in the state in which salt water is introduced as shown in (c) of FIG. 9A. Accordingly, based on the voltage level detected from the CC1 pin, the open state, the state in which fresh water is introduced, and the state in which salt water is introduced may be accurately determined in a first determining operation.

Similarly, as shown in (a), (b), and (c) of FIG. 9B, the voltage levels in the open state, in the state in which fresh water is introduced, and in the state in which salt water is introduced may also be greatly different from one another in the pull down operation with respect to the CC1 pin, and thus, the open state, the state in which fresh water is introduced, and the state in which salt water is introduced may be accurately determined based on the voltage levels detected from the CC1 pin.

However, referring to FIG. 9C, the resistance of salt water may be variable, and thus, the resistance range of the external device and the resistance range of the salt water may overlap each other. In some example embodiments, FIG. 9C illustrates the voltage level of the CC pin connected to the resistance Rd and the voltage level of the CC pin connected to the resistance Ra, the resistances Rd and Ra being defined in the USB Type-C structure, and the voltage level detected when there is salt water in the connector. In some example embodiments, the voltage level detected from the CC pin when the salt water is introduced into the connector may have the same or substantially the same value as the voltage level detected from the CC pin connected to the resistance Ra. Thus, the determining operation based on the voltage level may not accurately determine the state in which the external device is connected and the state in which the salt water is introduced.

Figure 10A:
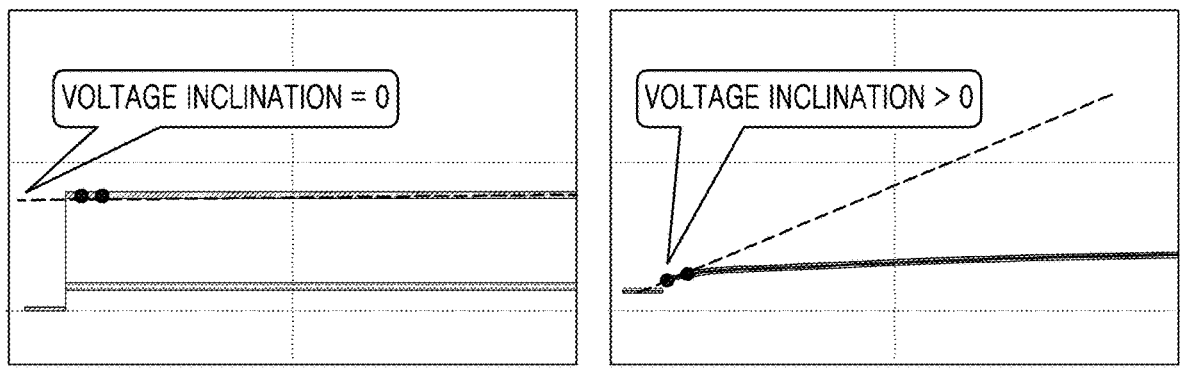
FIGS. 10A and 10B are graphs showing examples of voltage slopes in a state in which an external device is connected and in a state in which salt water is introduced according to some example embodiments of the inventive concepts.
Figure 10B:
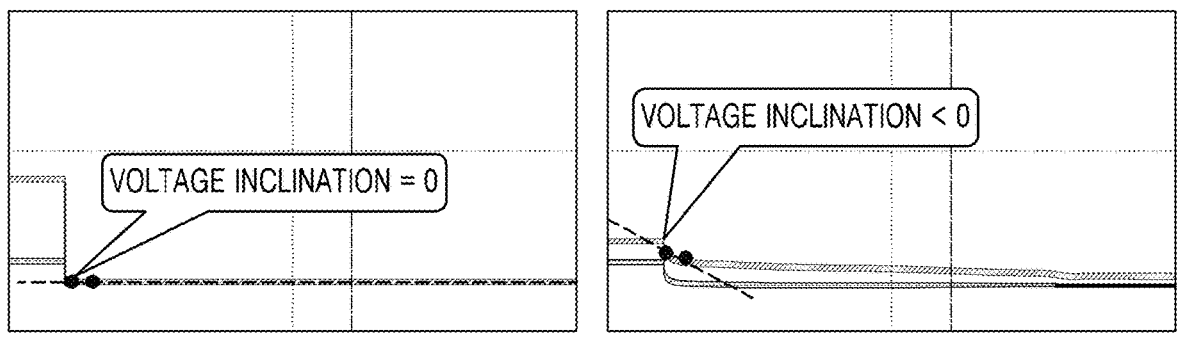

FIGS. 10A and 10B are graphs showing examples of voltage slopes in a state in which an external device is connected and a state in which salt water is introduced according to some example embodiments of the inventive concepts. FIG. 10A illustrates the examples of the voltage slopes in a pull up operation in the state in which the external device is connected and the state in which the salt water is introduced, and FIG. 10B illustrates the examples of the voltage slopes in a pull down operation. In some example embodiments, two lines illustrated in FIGS. 10A and 10B respectively indicate a voltage level of the CC pin connected to the resistance Rd and a voltage level of the CC pin connected to the resistance Ra described above, wherein the voltage slopes are detected based on the voltage level of the CC pin connected to the resistance Rd.

As shown in (a) of FIG. 10A, when the pull up operation is performed in the state in which the external device is connected, the voltage level may be sharply increased, and voltage levels at two time points at which the voltage levels are detected may be the same. However, as shown in (b) of FIG. 10A, in the situation in which salt water is introduced into the connector, the voltage level may be increased according to the charge and discharge characteristics, and the voltage slope may have a value based on the resistance element and the capacitance element of salt water. Similarly, as shown in (a) and (b) of FIG. 10B, voltage levels may be the same at two time points at which the voltage levels are detected, in the state in which the external device is connected, but in the situation in which salt water is introduced into the connector, the voltage slope may have a value based on the resistance element and the capacitance element of salt water. The second determining operation according to some example embodiments of the inventive concepts may accurately distinguish the external device and the salt water, by using the characteristics of the voltage slopes illustrated in FIGS. 10A and 10B.

FIGS. 10A and 10B illustrate the examples in which the voltage slope corresponds to 0 in the state in which the external device is connected, because the two time points to detect the voltage slope are selected to be after all voltage levels are pulled up or after all voltage levels are pulled down. However, example embodiments of the inventive concepts are not limited thereto. In some example embodiments, as described with respect to some example embodiments described above, the voltage level may be sharply changed in the pull up and pull down operations, when the connector is in an open state or an external device is connected to the connector, and unless the voltage level is changed in a desired way, the voltage slope may have a large value based on the change of the voltage level. That is, the voltage slope in the case in which the external device is connected to the connector may be defined to have a larger value than the voltage slope in the case in which salt water is introduced to the connector, which may be taken into account to set the time points to detect the voltage levels. Thereafter, based on these operations, the second determining operation using the voltage slope may be performed.

FIG. 11 is a table showing examples of resistances, capacitance elements, and voltage slopes in various states of a connector according to some example embodiments of the inventive concepts. FIG. 11 illustrates an example in which a pull up voltage is 3.7 V and the examples of the voltage slopes which may be detected when two time points to detect voltage levels to detect the voltage slope have a time difference of 1 ms. FIG. 11 illustrates the numerical examples applicable to the inventive concepts, and embodiments of the inventive concepts are not necessarily limited to the table shown in FIG. 11.

Referring to FIG. 11, when the connector is in an open state, the resistance may be very large to exceed about 1 M ohm, the capacitance element may have a value that is 0 or approximately 0, and the detected voltage slope may have a relatively very large value of 35 V/ms. In contrast, when an external device, such as a phone, etc., is connected to the connector, the resistance of about 5.1 K ohm may be applied to the CC1 pin, the capacitance element may have a value that is 0 or approximately 0, and the detected voltage slope may have a value of 18 V/ms, which is relatively smaller than the value of the voltage slope in the open state. Similarly, when a cable, such as a charger, etc., is connected to the connector, the voltage slope may have a value 20 V/ms, which is relatively smaller than the value of the voltage slope in the open state.

When a foreign substance, such as freshwater or salt water, is applied, the capacitance element may be applied to the CC1 pin along with the resistance element, and in this case, the voltage slope may have a value of 1.5 V/ms or 0.5 V/ms, which is relatively much smaller than the voltage slope in the case in which the connector is in the open state or the external device is connected to the connector. That is, when there is salt water in the connector, the voltage level detected from the CC1 pin may be similar to the voltage level in the case in which the cable is connected to the connector. However, whether or not a foreign substance exists in the connector may be accurately determined by detecting the voltage slope.

FIG. 11 illustrates an example in which the resistance range of fresh water is between 10 K ohm and 1 M ohm and the resistance range of salt water is between 0 K ohm through 10 K ohm. However, resistance ranges of various foreign substances may be variably defined.

Figure 12:
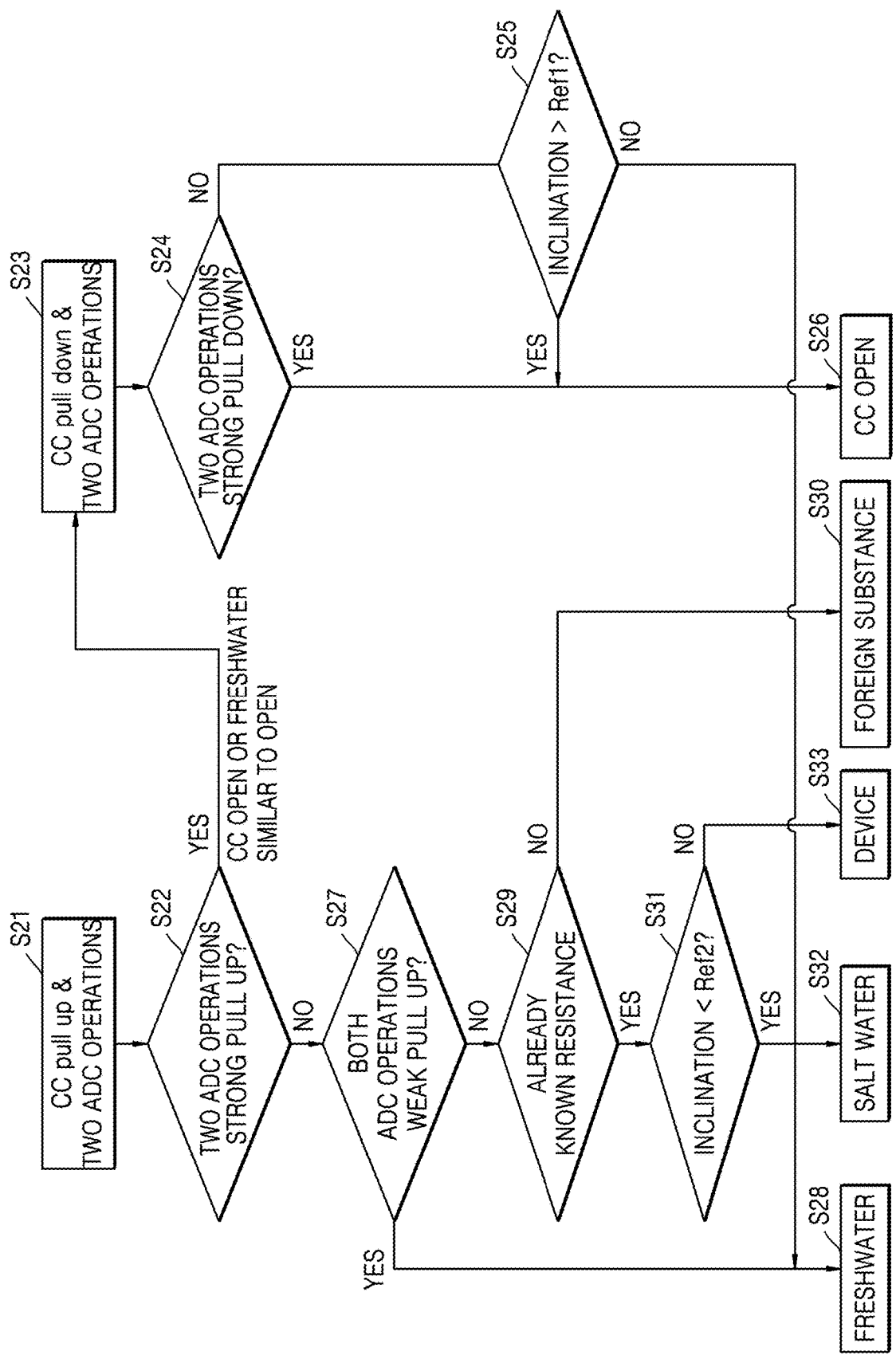
FIG. 12 is a flowchart of an example of general operations related to an operation of detecting a foreign substance according to some example embodiments of the inventive concepts.

FIG. 12 is a flowchart of an example of general operations related to an operation of detecting a foreign substance according to some example embodiments of the inventive concepts. FIG. 12 illustrates the example in which a voltage level is detected two times in each of a pull up operation and a pull down operation and the two detected voltage levels are used to determine a foreign substance in a first determining operation.

First, an ADC operation for detecting the voltage level in the pull up operation with respect to a CC pin (in some example embodiments, a CC1 pin or a CC2 pin) may be performed twice (S21) and whether the two ADC operations correspond to strong pull up operations may be determined (S22). That the ADC operation corresponds to the strong pull up operation indicates that the detected voltage level is very high, and this may correspond to a case in which a resistance applied to the CC pin is much higher than a resistance applied to the CC pin in other cases. That the two ADC operations correspond to the strong pull up operations may indicate that the CC pin is in an open state or there is freshwater having a very high resistance, in a connector, the resistance being approximately similar to a resistance corresponding to the open state, from among various states described above.

When it is determined that the both ADC operations correspond to the strong pull up operations, an ADC operation for detecting the voltage level in the pull down operation with respect to the CC pin may be performed twice (S23) and whether the two ADC operations correspond to strong pull down operations may be determined (S24). In some example embodiments, a voltage slope may be detected based on the voltage levels detected by the two ADC operations and the voltage slope (the slope used for comparison may correspond to a positive absolute value) may be compared with a first reference value Ref1 to determine whether the voltage levels are sharply changed (S25). That the ADC operation corresponds to the strong pull down operation indicates that the voltage level is decreased approximately to 0 V in the pull down operation, and when the both ADC operations correspond to the strong pull down operations or the voltage slope is greater than the first reference value Ref1, it may be determined that the CC pin is in the open state (S26). However, when the amount of change of the voltage is relatively small as the voltage slope is less than the first reference value Ref1, even when a high voltage level is detected in the pull up operation, it may be determined that the voltage level is changed based on the charge and discharge characteristics, and thus, it may be determined that freshwater exists in the connector (S28).

Meanwhile, in the operation of determining whether the ADC operations correspond to the strong pull up operations described above, when it is determined that the ADC operations do not correspond to the strong pull up operations, it may be determined whether the both ADC operations correspond to weak pull up operations (S27). That the ADC operation corresponds to the weak pull up operation indicates that although the voltage level detected from the CC pin is less than a voltage level corresponding to the open state, the detected voltage level is relatively larger than a voltage level of a case when the external device is connected to the connector, by having a larger resistance than a resistance of the case when the external device is connected to the connector. Here, when it is determined that the both ADC operations correspond to the weak pull up operations, it may be determined that a foreign substance (in some example embodiments, freshwater) having a high resistance is present in the connector (S28).

When it is determined that the ADC operation does not correspond to the weak pull up operation, it may be determined based on the detected voltage level whether the resistance of the CC pin corresponds to the resistance already known (S29). As described above, when the external device is connected to the connector in the USB Type-C structure, a resistance of a pre-defined range may be applied to the CC pin, and whether the resistance detected from the CC pin corresponds to this resistance range corresponding to the external device may be determined based on the voltage level. When the detected resistance does not correspond to the resistance range indicating the external device, it may be determined that other types of foreign substance having a resistance range different from a resistance range of freshwater or salt water are present in the connector (S30).

However, when it is determined that the resistance of the CC pin corresponds to the already known resistance, the resistance range indicating salt water may overlap the resistance range indicating the external device, as described above, and thus, the voltage slope may be detected to distinguish the resistance range of salt water and the resistance range of the external device, and whether the voltage slope is less than a second reference value Ref2 may be determined (S31). That the voltage slope is less than the second reference value Ref2 may indicate that the voltage level is smoothly changed, and in this case, it may be determined that salt water is present in the connector (S32). However, that the voltage slope is greater than the second reference value Ref2 may indicate that the voltage level is sharply changed, and in this case, it may be determined that the external device is connected to the connector (S33).

As shown in FIG. 5, when it is determined at S33 that the external device is connected to the connector, one or more operations (e.g., applying electrical power and/or voltage to one or more pins of the connector) may be performed (S42); in contrast, when it is determined at S30, S32, or S28 that a foreign substance, freshwater, or salt water is present in the connector, one or more operations (.g., applying electrical power and/or voltage to one or more pins of the connector) may be adjusted (e.g., reducing the applied electrical power and/or voltage) or canceled (e.g., blocking application of electrical power and/or voltage to one or more pins of the connector) (S41) to reduce or prevent corrosion of the connector or damage to the circuit device. Thus, an operation (e.g., providing electrical power to an external device via the connector) may be selectively and/or adjustably performed based upon whether it is determined that a foreign substance, freshwater, or salt water is present in the connector. Accordingly, performance of the electronic device (e.g., a computing device) and/or mitigation of damage, corrosion, etc. to the electronic device may be improved.

It will be understood that each of the operations illustrated in FIG. 12 and described herein with reference to FIG. 12 may be performed by one or more elements of the electronic device 100.

Figure 13:
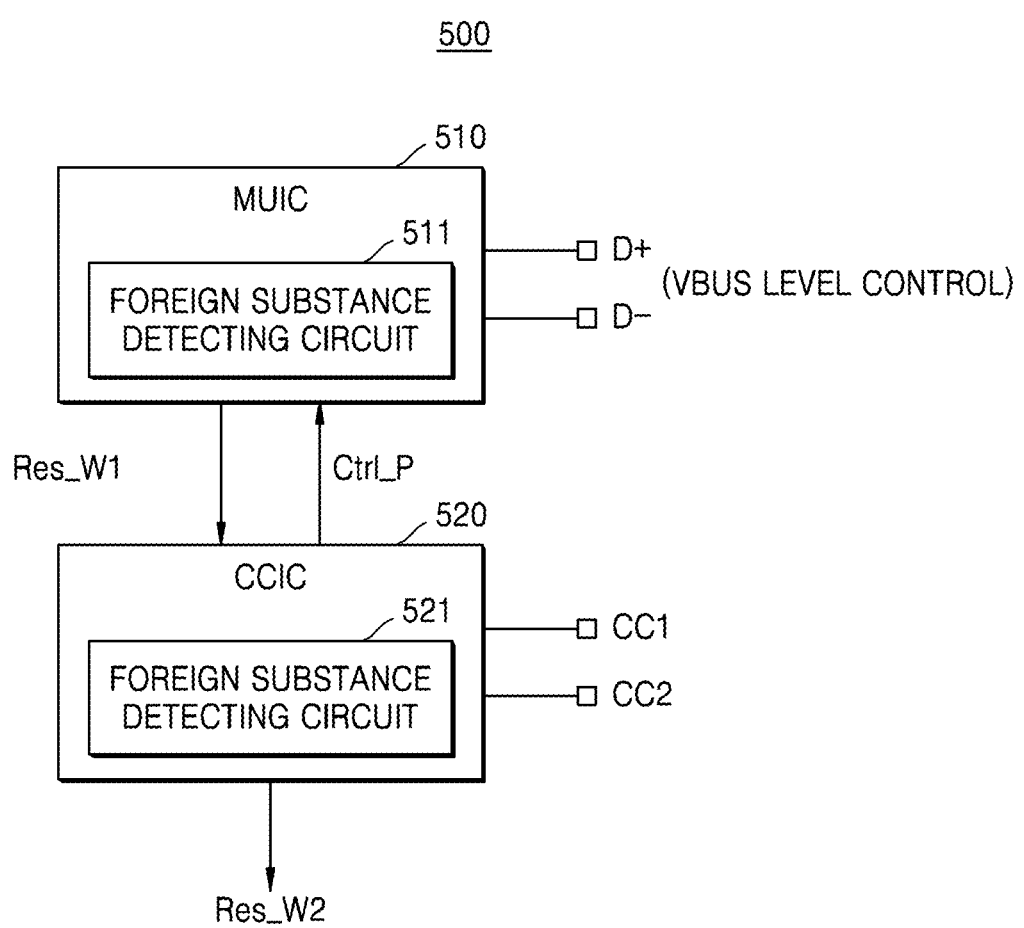
FIG. 13 is a block diagram showing an example in which the presence of a foreign substance is determined via at least two pins according to some example embodiments of the inventive concepts.

FIG. 13 is a block diagram showing an example in which the presence of a foreign substance is determined based on at least two pins according to some example embodiments of the inventive concepts.

Referring to FIG. 13, an electronic device 500 may include at least two foreign substance detecting circuits and may detect voltages from at least two pins and use the detected voltages for an operation of detecting the foreign substance. The electronic device 500 may include a plurality of ICs configured to perform various operations defined in the USB Type-C structure. In some example embodiments, the electronic device 500 may include a micro USB IC (MUIC) 510 and a CCIC 520. Each of the MUIC 510 and the CCIC 520 may perform a unique function in connection with at least one pin. In some example embodiments, the MUIC 510 may be connected to D+ pins A6 and B6 and D– pins A7 and B7 in the USB Type-C structure described above. The MUIC 510 may detect that an external device is connected via cable recognition and may communicate with the external device through the D+ pins A6 and B6 and the D– pins A7 and B7. In some example embodiments, the CCIC 520 may perform control operations for setting the DFP, the UFP, the DRP, etc., as described above.

The electronic device 500 may detect the voltage from each of a first pin and a second pin and may use the detected voltages for the operation of detecting the foreign substance, wherein the first pin and the second pin may include various types of pins defined in the USB Type-C structure. According to some example embodiments, the MUIC 510 may include a first foreign substance detecting circuit 511 and the CCIC 520 may include a second foreign substance detecting circuit 521. The MUIC 510 may be connected to the D+ pins A6 and B6 and the D– pins A7 and B7 described above and may further be connected to at least another pin included in the connector. In some example embodiments, the first pin described above may correspond to any one of the plurality of pins connected to the MUIC 510 and the second pin may include a CC1 pin or a CC2 pin.

In order to accurately determine whether there is the foreign substance, a determining operation may be performed through the voltages detected from the at least two pins from among the plurality of pins of the connector. As an example of the operation, the first foreign substance detecting circuit 511 may detect the voltage from the first pin and may output, to the CCIC 520, a first determining result Res_W1 indicating a foreign substance detecting result, based on the result(s) of determining the voltage level and/or the voltage slope according to some example embodiments described above.

The CCIC 520 may perform the operation of determining the foreign substance, based on the second pin, which is different from the first pin. The second foreign substance detecting circuit 521 may detect the voltage from the second pin and may output, in the electronic device 500, a second determining result Res_W2 indicating a foreign substance detecting result, based on the result(s) of determining the voltage level and/or the voltage slope according to some example embodiments described above. In some example embodiments, an application processor (not shown) in the electronic device 500 may recognize the second determining result Res_W2 from the CCIC 520 as a final foreign substance determining result.

Meanwhile, the MUIC 510 may communicate with the external device through at least one of the D+ pins A6 and B6 and the D– pins A7 and B7 and provide a request to decrease a power voltage (in some example embodiments, a VBUS voltage) or block the power voltage, to the external device. Here, when it is determined that the foreign substance is introduced into the connector, the request to block the power voltage may be provided to the external device and the CCIC 520 may provide a control signal Ctrl_P to the MUIC 510 based on the foreign substance determining result. Based on the control signal Ctrl_P, the MUIC 510 may provide the request to decrease the power voltage or block the power voltage to the external device when the foreign substance is introduced into the connector, for example at S41 and/or S20 as described above, and thus, corrosion of pins or damage to pins due to the foreign substance may be reduce or prevented.

Meanwhile, FIG. 13 illustrates the example in which it is finally determined that the foreign substance is present when the foreign substance is detected in both of the operations of detecting the foreign substance using the first and second pins. However, embodiments of the inventive concepts are not limited thereto. In some example embodiments, the electronic device 500 may be realized to finally determine that the foreign substance is present, when the operation of detecting the foreign substance is performed in each of the MUIC 510 and the CCIC 520, and when the foreign substance is present based on any one of the operations of the MUIC 510 and the CCIC 520.

Meanwhile, some example embodiments of the inventive concepts may be applied to various product groups. In some example embodiments, some example embodiments of the inventive concepts may be applied to various product groups using the USB Type-C structure, such as a personal computer (PC), a notebook computer, a smart phone, a monitor, a travel adaptor (TA), a dongle, etc.

While the inventive concepts has been particularly shown and described with reference to some example embodiments thereof, it will be understood that various changes in form and details may be made therein without departing from the spirit and scope of the following claims.

What is claimed is:
1. A foreign substance detecting circuit, comprising:
 a voltage detector electrically connected to at least one first pin of a connector, the connector including a plurality of pins, the voltage detector configured to detect a first voltage level from the at least one first pin;
 a slope detector configured to detect a voltage slope indicating an amount of change in voltage level, based on at least two voltage levels including the first voltage level detected from the at least one first pin by the voltage detector;
 a foreign substance determining device configured to determine whether a foreign substance is present in the connector based on performing a first determining operation and a second determining operation, wherein performing the first determining operation includes determining whether a resistance of the at least one first pin is within a resistance range corresponding to an external device, based on the first voltage level detected from the at least one first pin by the voltage detector, and performing the second determining operation includes determining whether the foreign substance is present in the connector, based on whether the voltage slope corresponds to a capacitance of the foreign substance.

2. The foreign substance detecting circuit of claim 1, wherein the voltage detector includes an analog to digital converter (ADC) configured to output a digital signal corresponding to the first voltage level detected from the at least one first pin.

3. The foreign substance detecting circuit of claim 1, wherein the foreign substance determining device comprises:

a primary determining device configured to determine whether the foreign substance is present in the connector based on performing the first determining operation, where the first determining operation includes comparing the first voltage level detected from the at least one first pin by the voltage detector with at least one reference voltage level; and a secondary determining device configured to determine whether the foreign substance is present in the connector based on performing the second determining operation, where the second determining operation includes comparing the voltage slope with a reference voltage slope value.

4. The foreign substance detecting circuit of claim 3, wherein the resistance range corresponding to the external device is a first resistance range, and the primary determining device is further configured to determine whether the external device is connected to the connector or the foreign substance is present in the connector, based on a determination of whether the resistance of the at least one first pin is within the first resistance range.

5. The foreign substance detecting circuit of claim 3, wherein the secondary determining device is further configured to determine whether the external device is connected to the connector or the foreign substance is present in the connector, based on a determination of whether the voltage slope is equal to or greater than the reference voltage slope value.

6. The foreign substance detecting circuit of claim 5, wherein the secondary determining device is further configured to selectively perform the second determining operation in response to a determination that the resistance of the at least one first pin is within the resistance range corresponding to the external device.

7. The foreign substance detecting circuit of claim 1, wherein the connector is further configured to perform communication based on a universal serial bus (USB) Type-C interface, and the at least one first pin includes at least one of a configuration channel 1 (CC1) pin and a configuration channel 2 (CC2) pin defined in the USB Type-C interface.

8. The foreign substance detecting circuit of claim 1, wherein the foreign substance determining device is further configured to determine that the connector is in an open state or that the foreign substance is present in the connector, based on the resistance of the at least one first pin being within a first resistance range in the first determining operation, the first resistance range defined to have a resistance corresponding to a case in which the connector is in the open state or freshwater is present in the connector.

9. The foreign substance detecting circuit of claim 8, wherein the foreign substance determining device is further configured to determine whether the connector is connected to the external device or salt water is present in the connector based on a value of the voltage slope in the second determining operation, after the resistance of the at least one first pin is determined to be within a second resistance range in the first determining operation, the second resistance range corresponding to a resistance range due to salt water.

10. The foreign substance detecting circuit of claim 1, wherein the second determining operation is performed in each of a pull up operation and a pull down operation with respect to the at least one first pin.

11. A method, comprising:

detecting a voltage level from a first pin of a connector, the connector including a plurality of pins;

determining whether a resistance of the first pin is within a first resistance range corresponding to connection of the connector with an external device, based on comparing the detected voltage level with a reference voltage level;

determining whether a foreign substance is present in the connector based on a determination of whether the resistance of the first pin is not within the first resistance range, or a comparison of a voltage slope detected based on the detected voltage level with a reference voltage slope value in response to a determination that the resistance of the first pin is within the first resistance range; and controlling an internal operation of an electronic device that includes the connector based on whether the foreign substance is determined to be present in the connector.

12. The method of claim 11, further comprising:

determining that the connector is in an open state or that freshwater is in the connector, such that the freshwater is the foreign substance, in response to a determination that the detected voltage level is equal to or greater than the reference voltage level; or determining that the external device is connected to the connector or that the foreign substance is present in the connector, in response to a determination that the detected voltage level is less than the reference voltage level.

13. The method of claim 12, further comprising:

determining whether the external device is connected to the connector or salt water is in the connector such that the salt water is the foreign substance based on a determination of whether the voltage slope is equal to or greater than the reference voltage slope value, in response to the determination that the detected voltage level is less than the reference voltage level and the resistance of the first pin is within the first resistance range.

14. The method of claim 13, further comprising:
determining that the salt water is in the connector, based on the determination that the detected voltage level is less than the reference voltage level and the resistance of the first pin is not within the first resistance range.

15. The method of claim 11, wherein
the first pin includes at least one of a configuration channel 1 (CC1) pin and a configuration channel 2 (CC2) pin defined in a universal serial bus (USB) Type-C interface.

16. An electronic device, comprising:
a connector configured to connect to an external device and including a plurality of pins;
a foreign substance detecting circuit configured to determine whether a foreign substance is present in the connector or the external device is connected to the connector based on performing a first determining operation and a second determining operation, wherein
performing the first determining operation includes determining whether a resistance of a first pin of the connector is within a resistance range corresponding to the external device, and
performing the second determining operation includes determining whether the foreign substance is present in the connector, based on a voltage slope determined based on a voltage level detected from the first pin,
wherein the foreign substance detecting circuit is configured to determine whether the external device is connected to the connector in response to determining whether both the resistance of the first pin is within the resistance range of the external device and the voltage slope satisfies a certain condition; and
an application processor configured to control an internal operation of the electronic device in response to the determination of whether the foreign substance is present in the connector or the external device is connected to the connector.

17. The electronic device of claim 16, wherein the foreign substance detecting circuit is further configured to
determine whether the external device is connected to the connector or the foreign substance is present in the connector, based on a determination of whether the voltage slope is equal to or greater than a reference voltage slope value in the second determining operation.

18. The electronic device of claim 16, wherein
the resistance range of the external device is a first resistance range, and
the foreign substance detecting circuit is further configured to
determine that the foreign substance is present in the connector in response to a determination that the resistance of the first pin is not within the first resistance range in the first determining operation, and
selectively perform the second determining operation in response to a determination that the resistance of the first pin is within the first resistance range in the first determining operation.

19. The electronic device of claim 16, wherein
the connector is configured to perform communication based on a universal serial bus (USB) Type-C interface, and
the first pin includes at least one of a configuration channel 1 (CC1) pin and a configuration channel 2 (CC2) pin defined in the USB Type-C interface.

20. The electronic device of claim 19, further comprising:
a configuration channel integrated circuit (CCIC) configured to perform data connection and control operations through at least one of the CC1 pin and the CC2 pin, wherein
the foreign substance detecting circuit is included in the CCIC.

* * * * *